US009941315B2

(12) United States Patent
Tashiro

(10) Patent No.: US 9,941,315 B2
(45) Date of Patent: Apr. 10, 2018

(54) PHOTOELECTRIC CONVERSION DEVICE AND IMAGING SYSTEM

(71) Applicant: CANON KABUSHIKI KAISHA, Tokyo (JP)

(72) Inventor: Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 46 days.

(21) Appl. No.: 15/288,800

(22) Filed: Oct. 7, 2016

(65) Prior Publication Data
US 2017/0154908 A1 Jun. 1, 2017

(30) Foreign Application Priority Data

Nov. 26, 2015 (JP) ................................ 2015-230335

(51) Int. Cl.
*H01L 27/146* (2006.01)
*H04N 5/363* (2011.01)
*H04N 5/378* (2011.01)
*H04N 5/3745* (2011.01)

(52) U.S. Cl.
CPC .... *H01L 27/14605* (2013.01); *H01L 27/1461* (2013.01); *H01L 27/1462* (2013.01); *H01L 27/14609* (2013.01); *H01L 27/14636* (2013.01); *H04N 5/363* (2013.01); *H04N 5/378* (2013.01); *H04N 5/3745* (2013.01); *H01L 27/14692* (2013.01)

(58) Field of Classification Search
None
See application file for complete search history.

(56) References Cited

U.S. PATENT DOCUMENTS 5,159,422 A 10/1992 Tashiro
5,366,921 A 11/1994 Tashiro
6,069,393 A 5/2000 Hatanaka
(Continued)

FOREIGN PATENT DOCUMENTS

WO 2012/004923 1/2012

OTHER PUBLICATIONS

U.S. Appl. No. 15/245,437, filed Aug. 24, 2016.
U.S. Appl. No. 15/351,965, filed Nov. 15, 2016.

*Primary Examiner* — James Hannett
(74) *Attorney, Agent, or Firm* — Fitzpatrick, Cella, Harper & Scinto

(57) ABSTRACT

A photoelectric conversion device includes a photoelectric conversion unit including a first and second electrodes, a photoelectric conversion layer between the first and second electrodes, and an insulating layer between the photoelectric conversion layer and the second electrodes, an amplifier unit connected to the second electrode and outputs a signal generated in the photoelectric conversion unit, and a reset unit for resetting a voltage of the second electrode. An accumulating operation for accumulating signal charges in the photoelectric conversion unit and a charge removing operation for removing the signal charges from the photoelectric conversion unit are alternately executed in accordance with a voltage applied between the first and second electrodes, and the charge removing operation is executed multiple times between a first accumulating operation and a second accumulating operation which is executed after the first accumulating operation.

20 Claims, 18 Drawing Sheets

(56) References Cited

U.S. PATENT DOCUMENTS

| | | |
|---|---|---|
| 6,717,151 B2 | 4/2004 | Tashiro |
| 6,800,836 B2 | 10/2004 | Hamamoto |
| 7,129,458 B2 | 10/2006 | Hamamoto |
| 9,025,059 B2 | 5/2015 | Tashiro |
| 9,261,769 B2 | 2/2016 | Tashiro |
| 9,438,836 B2 | 9/2016 | Tashiro |
| 9,455,289 B2 | 9/2016 | Tashiro |
| 2001/0000068 A1* | 3/2001 | Isogai ............... H01L 27/14609 257/443 |
| 2007/0272828 A1* | 11/2007 | Xu ........................ H04N 5/361 250/208.1 |
| 2015/0215562 A1 | 7/2015 | Tashiro |
| 2016/0150174 A1* | 5/2016 | Hynecek ............ H04N 5/37457 348/308 |
| 2016/0295140 A1 | 10/2016 | Moriyama |
| 2016/0295147 A1 | 10/2016 | Tashiro |
| 2016/0380025 A1* | 12/2016 | Rothberg ........... G01N 21/6408 250/206 |

\* cited by examiner

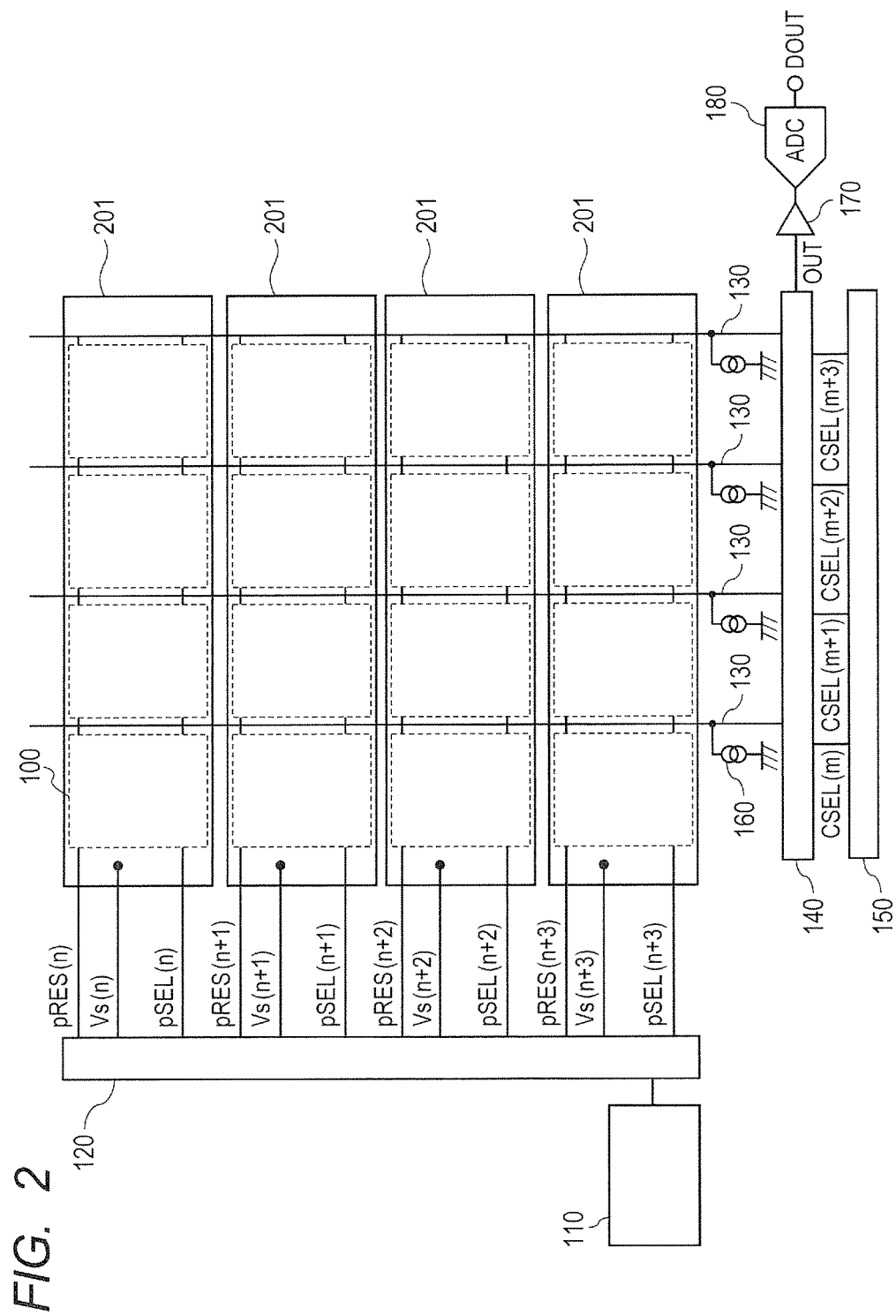

PHOTOELECTRIC CONVERSION DEVICE AND IMAGING SYSTEM

BACKGROUND OF THE INVENTION

Field of the Invention

The present invention relates to a photoelectric conversion device and an imaging system.

Description of the Related Art

As a photoelectric conversion device which is used for an image sensor of a camera or the like, a stacked-type photoelectric conversion device has been proposed. In a photoelectric conversion device disclosed in FIG. 1 of International Publication No. WO2012/004923, a photoelectric conversion film is stacked over a semiconductor substrate. A transparent electrode is arranged on the photoelectric conversion film and a pixel electrode is arranged under the photoelectric conversion film. An insulating film is arranged between the photoelectric conversion film and the pixel electrode. The International Publication No. WO2012/004923 discloses such a point that since correlated double sampling can be performed by such a construction, noise can be reduced.

In the photoelectric conversion device disclosed in the International Publication No. WO2012/004923, after a voltage VPk which is applied to the transparent electrode is swung, a signal readout is performed. Although a time which is required for the readout is not disclosed, dark electric charges and photo-induced charges are accumulated in the photoelectric conversion film for a period of time until the readout is finished, and residual charges are generated after the readout and become an error of a light signal component.

SUMMARY OF THE INVENTION

An object of the present invention is to provide a photoelectric conversion device which can precisely detect a light signal component while reducing noise.

According to an aspect of the present invention, there is provided a photoelectric conversion device including a photoelectric conversion unit including a first electrode, a second electrode, a photoelectric conversion layer arranged between the first electrode and the second electrode, and an insulating layer arranged between the photoelectric conversion layer and the second electrode, an amplifier unit electrically connected to the second electrode and configured to output a signal generated in the photoelectric conversion unit, and a reset unit configured to reset a voltage of the second electrode, wherein in accordance with a voltage applied between the first electrode and the second electrode, an accumulating operation for accumulating signal charges in the photoelectric conversion unit and a charge removing operation for removing the signal charges accumulated by the accumulating operation from the photoelectric conversion unit are alternately executed, and the charge removing operation is executed multiple times between a first accumulating operation and a second accumulating operation which is executed after the first accumulating operation, the accumulating operation being executed multiple times including the first and second accumulating operations.

Further features of the present invention will become apparent from the following description of exemplary embodiments with reference to the attached drawings.

BRIEF DESCRIPTION OF THE DRAWINGS

FIG. 2 is a diagram schematically illustrating a general configuration of the photoelectric conversion device according to the first embodiment.

DESCRIPTION OF THE EMBODIMENTS

Figure 1A:
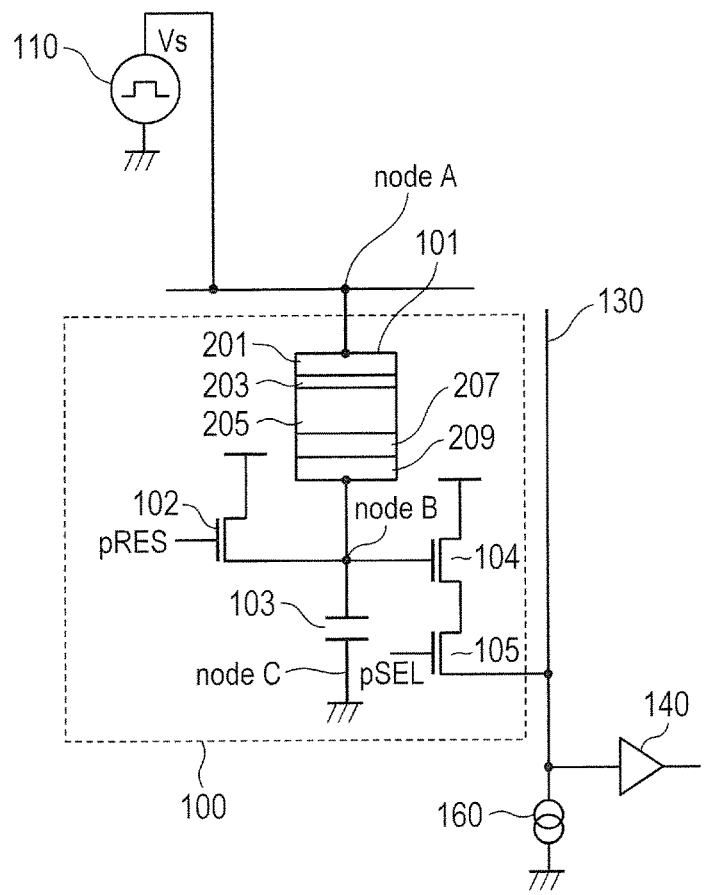
FIGS. 1A, 1B and 1C are diagrams schematically illustrating a configuration of a pixel of a photoelectric conversion device according to a first embodiment.

Preferred embodiments of the present invention will now be described in detail in accordance with the accompanying drawings.

One embodiment according to the present invention is a photoelectric conversion device. A pixel included in the photoelectric conversion device includes a photoelectric conversion unit, an amplifier unit for amplifying a signal generated in the photoelectric conversion unit, and a reset unit for supplying a reset voltage to the amplifier unit. The photoelectric conversion device may include a plurality of pixels. Such a photoelectric conversion device is, for example, an image sensor. Or, the photoelectric conversion device may include only one pixel. Such a photoelectric conversion device is, for example, a photodetector. A pixel 100, a photoelectric conversion unit 101, a reset transistor 102, and an amplifier transistor 104 are illustrated as an example in FIG. 1A.

The photoelectric conversion unit includes a first electrode, a second electrode, a photoelectric conversion layer arranged between the first electrode and the second electrode, and an insulating layer arranged between the photoelectric conversion layer and the second electrode. According to such a configuration, the photoelectric conversion unit can accumulate charges, as a signal charge, generated by incident light. By controlling a voltage which is supplied to a pixel circuit including the photoelectric conversion unit, a signal from the photoelectric conversion unit can be read out. A first electrode 201, a photoelectric conversion layer 205, an insulating layer 207, and a second electrode 209 are illustrated as an example in FIG. 1A.

The second electrode is electrically connected to the amplifier unit. According to such a configuration, the amplifier unit can output the signal generated in the photoelectric conversion unit. The second electrode and the amplifier unit may be short-circuited. Or, a switch may be arranged on an electric path between the second electrode and the amplifier unit. A node B showing an electrical connection of the second electrode and the amplifier unit is illustrated as an example in FIG. 1A. The node B is configured so that it can be an electrical floating state. The node B is electrically floated, whereby a voltage of the node B can change in accordance with the charges generated in the photoelectric conversion unit. Therefore, the signal corresponding to the charges generated in the photoelectric conversion unit can be input to the amplifier unit.

The photoelectric conversion device includes a reset unit for resetting a voltage of the second electrode. The reset unit supplies a reset voltage to the second electrode. The reset unit is, for example, a reset transistor electrically connected to the second electrode. The reset transistor 102 is illustrated as an example in FIG. 1A. The reset unit is controlled in such a manner that ON and OFF are switched. By turning on the reset unit, the reset voltage is supplied to the second electrode. A switch may be arranged on an electric path between the reset unit and the second electrode. The reset unit and the second electrode may be short-circuited.

A first capacitor is electrically connected to the second electrode. A first capacitor 103 is illustrated as an example in FIG. 1A. The second electrode and the first capacitor may be short-circuited or a switch may be arranged on an electric path between the second electrode and the first capacitor.

The first capacitor is configured, for example, so as to include two electrodes which face each other with an insulating member interposed therebetween. The two electrodes are made of a conductive material such as polycrystalline silicon, metal, or the like. Or, the first capacitor is configured so as to include a semiconductor region and a gate electrode arranged over the semiconductor region with a gate insulating film interposed therebetween. It is desirable that the semiconductor region included in the first capacitor has an impurity concentration larger than that of a source region or a drain region of the transistor. The gate electrode is made of a conductive material such as polycrystalline silicon, metal, or the like.

The first capacitor includes a first terminal electrically connected to the second electrode and a second terminal different from the first terminal. Each terminal can be made of a conductive material such as metal, polycrystalline silicon, or the like or can be formed by a semiconductor region. A predetermined voltage is supplied to the second terminal. For example, the second terminal may be grounded. Or, the second terminal may be connected to a voltage supply unit and a plurality of voltages may be supplied from the voltage supply unit. In FIG. 1A, the node B includes the first terminal and a node C includes the second terminal.

In one embodiment of the present invention, when the signal is read out, the photoelectric conversion layer is converted into a depletion layer. For this purpose, the voltage of the first electrode of the photoelectric conversion unit or the voltage of the second terminal of the first capacitor is controlled. Specifically speaking, the voltage supply unit for supplying the first voltage and the second voltage different from the first voltage is provided.

In several embodiments, the voltage supply unit supplies the first voltage and the second voltage different from the first voltage to the first electrode of the photoelectric conversion unit. Such a voltage supply unit 110 is illustrated as an example in FIG. 1A. In another embodiment, the voltage supply unit supplies the first voltage and the second voltage different from the first voltage to the second terminal of the first capacitor. Such a voltage supply unit 410 is illustrated as an example in FIG. 8.

Subsequently, an effect of a noise reduction by the embodiments of the present invention will be described.

When the voltage of the first electrode of the photoelectric conversion unit or the voltage of the second terminal of the first capacitor changes, the voltage of the second electrode of the photoelectric conversion unit changes in accordance with a ratio between a capacitance value of the first capacitor and a capacitance value of the second capacitor which is formed by the first and second electrodes. This is because in an equivalent circuit of the pixel, the first capacitor and the second capacitor are expressed as two capacitors which are serially connected and the second electrode is included in a node between the two capacitors.

In the embodiments of the present invention, the voltage of the first electrode of the photoelectric conversion unit or the voltage of the second terminal of the first capacitor and the voltage which is supplied by the reset unit, the capacitance value of the first capacitor, and the capacitance value of the second capacitor have a predetermined relation. By satisfying such a relation, even if the voltage of the second electrode changes, the voltage adapted to deplete the photoelectric conversion layer can be applied between the first and second electrodes of the photoelectric conversion unit. Therefore, an amount of charges which are not removed from the photoelectric conversion layer can be decreased. Thus, the noise can be reduced.

According to another aspect of the embodiments of the present invention, the first capacitor is configured so as to include the two electrodes which face each other. According to such a construction, a degree of freedom of a design of a capacitance ratio is improved. Therefore, the foregoing relation can be easily satisfied. Thus, a degree of freedom of a design of the photoelectric conversion device in which the noise is reduced is improved.

In the embodiments of the present invention, by alternately supplying the first voltage and the second voltage different from the first voltage from the voltage supply unit, the charges in the photoelectric conversion unit can be removed independent of the resetting of the node B. Although details will be described hereinafter, consequently, after a light signal S is read out, the charges remaining in the photoelectric conversion film can be perfectly removed.

The embodiments of the present invention will be described in detail hereinbelow with reference to the drawings. However, the present invention is not limited to only the embodiments, which will be described hereinbelow. A modification obtained by changing a partial configuration of the embodiments, which will be described hereinbelow, within a scope without departing from the spirit of the present invention is also an embodiment of the present invention. An example obtained by adding a partial configuration of any one of the following embodiments to another embodiment or an example obtained by replacing it to a partial configuration of another embodiment is also an embodiment of the present invention.

First Embodiment

A photoelectric conversion device according to a first embodiment will be described hereinbelow with reference to FIGS. 1A to 7.

FIG. 1A schematically illustrates a configuration of a pixel 100 of the photoelectric conversion device according to the present embodiment. The pixel 100 includes a photoelectric conversion unit 101, a reset transistor 102, a first capacitor 103, an amplifier transistor 104, and a select transistor 105. Although only one pixel 100 is illustrated in FIG. 1A, the photoelectric conversion device of the present embodiment includes a plurality of pixels 100. A cross-sectional structure of the photoelectric conversion unit 101 is schematically illustrated in FIG. 1A.

The photoelectric conversion unit 101 includes a first electrode 201, a blocking layer 203, a photoelectric conversion layer 205, an insulating layer 207, and a second electrode 209. The first electrode 201 is included in a "node A" in FIG. 1A. The second electrode 209 is included in a "node B" in FIG. 1A. The first electrode 201 is connected to the voltage supply unit 110. The voltage supply unit 110 is configured so that it can supply a plurality of kinds of voltages Vs to the first electrode 201 of the photoelectric conversion unit 101. According to such a configuration, an accumulation of the signal charges in the photoelectric conversion unit 101 and a removal of the signal charges from the photoelectric conversion unit 101 can be performed. The removal of the signal charges is performed to read out the signal generated in the photoelectric conversion unit 101.

The voltage supply unit 110 supplies at least a first voltage Vs1 and a second voltage Vs2 different from the first voltage Vs1 to the first electrode 201 of the photoelectric conversion unit 101. When the signal charges are holes, the second voltage Vs2 is lower than the first voltage Vs1. When the signal charges are the holes, for example, the first voltage Vs1 is 5 V and the second voltage Vs2 is 0 V. When the signal charges are electrons, the second voltage Vs2 is higher than the first voltage Vs1. When the signal charges are the electrons, for example, the first voltage Vs1 is 0 V and the second voltage Vs2 is 5 V. In this specification, it is assumed that a voltage of a grounded node is set to 0 V as a reference voltage unless otherwise specified.

A gate of the amplifier transistor 104 is included in the node B in FIG. 1A. The amplifier transistor 104 is an amplifier unit. The gate of the amplifier transistor 104 is an input node of the amplifier unit. That is, the second electrode 209 of the photoelectric conversion unit 101 is electrically connected to the amplifier unit. According to such a configuration, the amplifier unit can amplify the signal generated in the photoelectric conversion unit 101 and output the amplified signal.

The second electrode 209 is electrically connected to a first terminal of the first capacitor 103. In the present embodiment, the first terminal of the first capacitor 103 is included in the node B. That is, the second electrode 209 and the first terminal of the first capacitor 103 are short-circuited. A second terminal of the first capacitor 103 is included in a "node C" in FIG. 1A. The second terminal is capacitively coupled to the first terminal. When considering from another viewpoint, the node C is capacitively coupled to the node B via the first capacitor 103. A predetermined voltage is supplied to the second terminal (node C) of the first capacitor 103. In the present embodiment, the second terminal (node C) of the first capacitor 103 is connected to the ground. That is, a voltage of 0 V is supplied to the second terminal of the first capacitor 103.

A drain of the reset transistor 102 is connected to the node to which a reset voltage Vres is supplied. A source of the reset transistor 102 is connected to the second electrode 209 of the photoelectric conversion unit 101 and the gate of the amplifier transistor 104. According to such a configuration, the reset transistor 102 can reset the voltage of the node B to the reset voltage Vres. That is, the reset transistor 102 is a reset unit for supplying the reset voltage Vres to the second electrode 209. When the reset transistor 102 is turned off, the node B configured so as to include the second electrode 209 of the photoelectric conversion unit 101 becomes an electrical floating state.

In the present embodiment, by controlling a magnitude relation between the voltage Vs which is supplied to the first electrode 201 of the photoelectric conversion unit 101 and the reset voltage Vres, the accumulation of the signal charges in the photoelectric conversion unit 101 and the removal of the signal charges from the photoelectric conversion unit 101 are performed. The reset voltage Vres is an intermediate value between the first voltage Vs1 and the second voltage Vs2. For example, when the signal charges are the holes, the reset voltage Vres is lower than the first voltage Vs1 and is higher than the second voltage Vs2. When the signal charges are the electrons, the reset voltage Vres is higher than the first voltage Vs1 and is lower than the second voltage Vs2. In the present embodiment, the reset voltage Vres is set to 3.3 V. The reset voltage Vres is lower than a power supply voltage Vdd and is higher than the voltage which is supplied to the node connected to the ground. The reset voltage Vres may be equal to the power supply voltage Vdd. It is assumed hereinbelow that the reset voltage Vres and the power supply voltage Vdd are connected to a same power source. In the case where they are connected to different power sources, a further description will be made in accordance with necessity.

A drain of the amplifier transistor 104 is connected to the node to which the power supply voltage Vdd is supplied. A source of the amplifier transistor 104 is connected to an output line 130 via the select transistor 105. A current source 160 is connected to the output line 130. The amplifier transistor 104 and the current source 160 constitute a source-follower circuit and output the signal generated in the photoelectric conversion unit 101 to the output line 130. A column circuit 140 is further connected to the output line 130. The signal from the pixel 100 which is output to the output line 130 is input to the column circuit 140. In the present embodiment, the reset voltage Vres and the power supply voltage Vdd are supplied from the same power source.

Figure 1B:
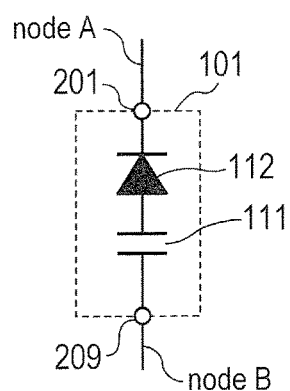
Figure 1C:
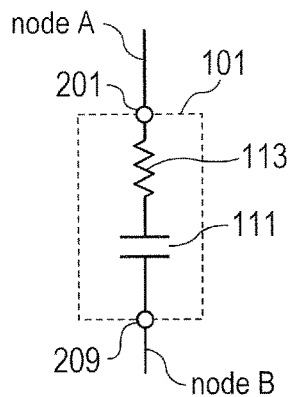

Each of FIGS. 1B and 1C illustrates an example of an equivalent circuit diagram of the photoelectric conversion unit 101. The photoelectric conversion unit 101 in the present embodiment includes a photoelectric conversion layer configured so as to accumulate the signal charges and an insulating layer. Therefore, the photoelectric conversion unit 101 includes a capacitive component between the first electrode 201 and the second electrode 209. In the equivalent circuit of each of FIGS. 1B and 1C, the capacitive component is illustrated as a second capacitor 111 arranged between the first electrode 201 and the second electrode 209 of the photoelectric conversion unit 101. FIG. 1B illustrates an example of the equivalent circuit in the case where the photoelectric conversion unit 101 includes a blocking layer. Therefore, the blocking layer and the photoelectric conversion layer are illustrated by circuit symbols of a diode 112. FIG. 1C illustrates an example of the equivalent circuit in the case where the photoelectric conversion unit 101 does not include a blocking layer. Therefore, the photoelectric conversion layer is illustrated by circuit symbols of a resistor 113. A structure of the photoelectric conversion unit 101 will be described hereinafter.

FIG. 2 is a diagram schematically illustrating a general circuit configuration of the photoelectric conversion device according to the present embodiment. Portions having substantially the same functions as those in FIG. 1A are designated by the same reference numerals.

FIG. 2 illustrates sixteen pixels 100 arranged in a matrix form of 4 rows and 4 columns. A plurality of pixels 100 included in one column are connected to one output line 130. A row driving circuit 120 supplies a driving signal pRES and a driving signal pSEL to the pixels 100. The driving signal pRES is supplied to a gate of the reset transistor 102. The driving signal pSEL is supplied to a gate of the select transistor 105. By those driving signals, the reset transistor 102 and the select transistor 105 are controlled. A plurality of pixels 100 included in one row are connected to a common driving signal line. The driving signal line is an interconnection for transmitting the foregoing driving signals pRES and pSEL and the like. In FIG. 2, in order to distinguish the driving signals which are supplied to different rows, reference characters such as (n), (n+1), and the like showing the rows are added to reference characters indicating the driving signals. This is true of other drawings.

FIG. 2 schematically illustrates a planar structure of the first electrode 201 of the photoelectric conversion unit 101. As illustrated in FIG. 2, the photoelectric conversion units 101 of a plurality of pixels 100 included in one row are configured so as to include the common first electrode 201. As mentioned above, the voltage supply unit 110 supplies the voltage Vs to the first electrode 201. In the present embodiment, the first electrode 201 is arranged every row. Therefore, the row driving circuit 120 selects the row to which the voltage Vs is supplied from the voltage supply unit 110. In order to distinguish the voltages Vs which are supplied to the different rows, reference characters such as (n), (n+1), and the like showing the rows are added to reference characters indicating the voltages Vs.

According to the configuration described above, in the present embodiment, a plurality of pixels 100 can be driven every row.

Each output line 130 is connected to the column circuit 140. A column driving circuit 150 drives the column circuit 140 every column. Specifically speaking, the column driving circuit 150 supplies a driving signal CSEL to a plurality of column circuits 140. In order to distinguish the driving signals which are supplied to the different columns, reference characters such as (m), (m+1), and the like showing the columns are added to reference characters indicating the driving signals. This is true of other drawings. According to such a configuration, the signals which are read out in parallel every row can be sequentially output to an outputting unit 170.

Figure 3:
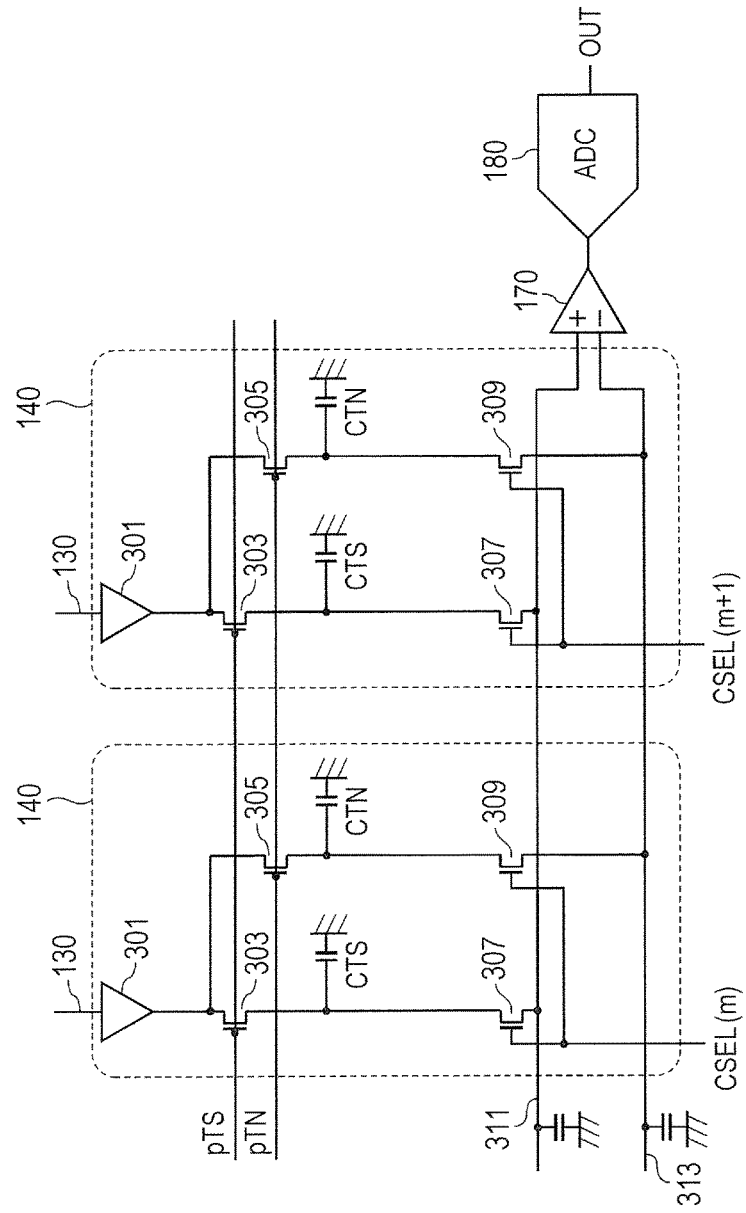
FIG. 3 is a diagram illustrating an equivalent circuit of a column circuit of the photoelectric conversion device according to the first embodiment.

The column circuit 140 will be described in detail. FIG. 3 illustrates an equivalent circuit of the column circuit 140 of each of the m-th column and the (m+1)-th column. The column circuits 140 of other columns are not illustrated.

The signal of the output line 130 is amplified by a column amplifier 301. An output node of the column amplifier 301 is connected to a capacitor CTS via an S/H switch 303. An output node of the column amplifier 301 is connected to a capacitor CTN via an S/H switch 305. The S/H switch 303 and the S/H switch 305 are controlled by a driving signal pTS and a driving signal pTN, respectively. According to such a configuration, a noise signal N including reset noise from the pixel 100 and the light signal S can be held. Therefore, the photoelectric conversion device according to the present embodiment can perform the correlated double sampling.

The capacitor CTS is connected to a horizontal output line 311 via a horizontal transfer switch 307. The capacitor CTN is connected to a horizontal output line 313 via a horizontal transfer switch 309. The horizontal transfer switches 307 and 309 are controlled by the driving signal CSEL from the column driving circuit 150.

Both of the horizontal output line 311 and the horizontal output line 313 are connected to the output unit 170. The output unit 170 outputs a difference between the signal of the horizontal output line 311 and the signal of the horizontal output line 313 to an analog/digital conversion unit (hereinbelow, referred to as an A/D conversion unit) 180. The A/D conversion unit 180 converts an analog signal which is input into a digital signal.

The column circuit 140 may be an analog/digital (A/D) conversion circuit. In this case, the A/D conversion circuit includes a holding unit such as memory, counter, or the like for holding the digital signal. Each of the noise signal N and the light signal S is converted into a digital signal and held in the holding unit.

Figure 4:
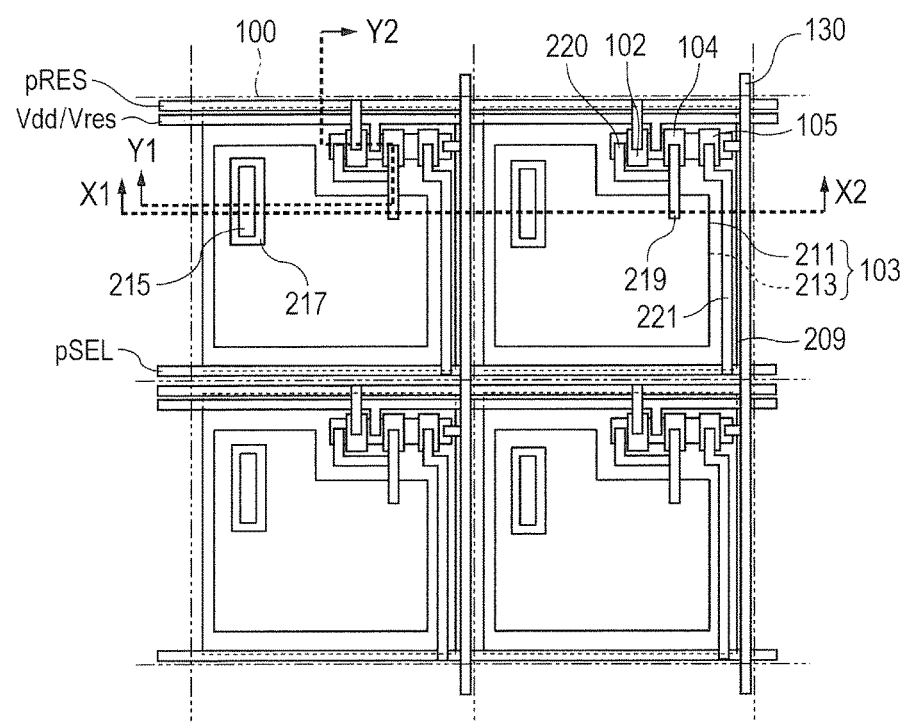
FIG. 4 is a diagram schematically illustrating a planar structure of the photoelectric conversion device according to the first embodiment.
Figure 5A:
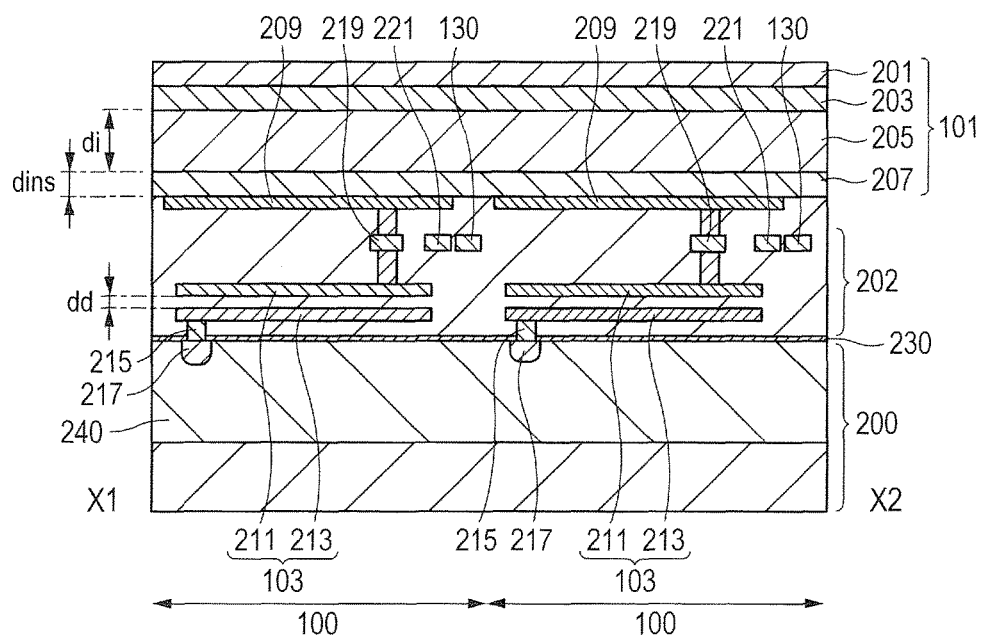
FIGS. 5A and 5B are diagrams each schematically illustrating a cross-sectional structure of the photoelectric conversion device according to the first embodiment.
Figure 5B:
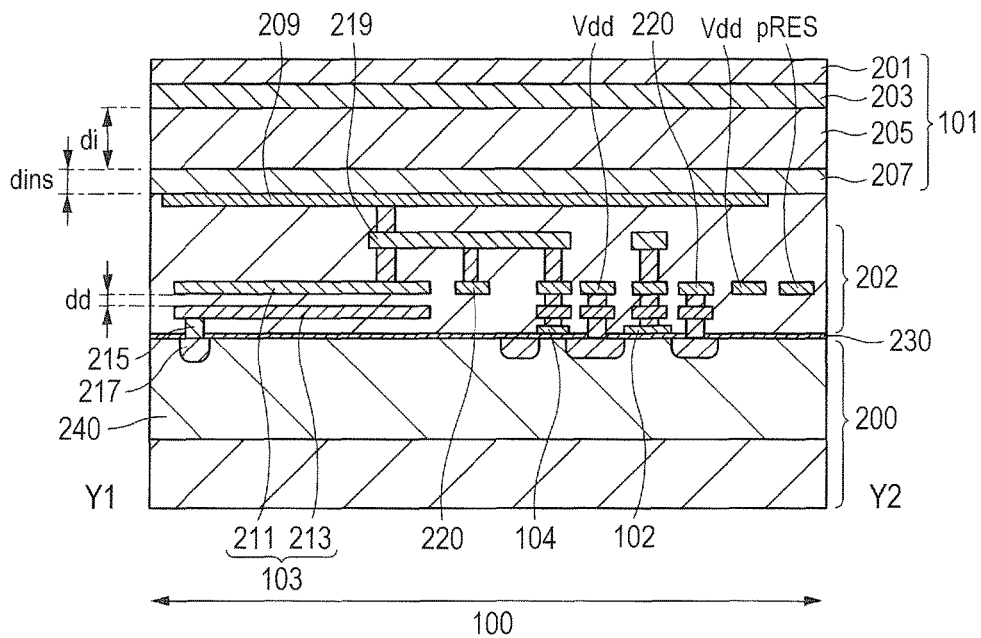

Subsequently, a planar structure and a cross-sectional structure of the photoelectric conversion device according to the present embodiment will be described. FIG. 4 schematically illustrates the planar structure of the photoelectric conversion device. FIGS. 5A and 5B schematically illustrate the cross-sectional structure of the photoelectric conversion device. FIG. 4 illustrates four pixels 100 arranged in a matrix form of 2 rows and 2 columns. The cross-section illustrated in FIG. 5A corresponds to a cross-section taken along the broken line X1-X2 in FIG. 4. The cross-section illustrated in FIG. 5B corresponds to a cross section taken along the broken line Y1-Y2 in FIG. 4. Portions having substantially the same functions as those in FIG. 1A are designated by the same reference numerals. However, with respect to the transistors, each of the reference numeral indicates the corresponding gate electrode. The same reference character as that of the driving signal which is supplied to the relevant driving signal line is added to a conductive member forming the driving signal line. For example, the conductive member added with the reference character pRES corresponds to the driving signal line for supplying the driving signal pRES.

The photoelectric conversion device includes a semiconductor substrate 200. Various kinds of semiconductor regions such as source region, drain region, and the like of pixel transistors are arranged in the semiconductor substrate 200. The pixel transistors are, for example, the reset transistor 102, amplifier transistor 104, and select transistor 105. Gate electrodes of the pixel transistors and a plurality of interconnection layers 202 containing conductive members forming interconnections are arranged over the semiconductor substrate 200. The photoelectric conversion unit 101 is arranged over the interconnection layer 202. In FIG. 4, the drain of the reset transistor 102 and the drain of the amplifier transistor are connected to a same power supply line Vdd/Vres and the same voltage is supplied to them.

As illustrated in FIGS. 5A and 5B, the photoelectric conversion unit 101 of each pixel 100 includes the first electrode 201 (common electrode), blocking layer 203, photoelectric conversion layer 205, insulating layer 207, and second electrode 209 (pixel electrode). The photoelectric conversion layer 205 is arranged between the first electrode 201 and the second electrode 209. The blocking layer 203 is arranged between the first electrode 201 and the photoelectric conversion layer 205. The blocking layer 203 is provided to block such a state that charges of the same conductivity type as that of the signal charges which are accumulated in the photoelectric conversion layer 205 are injected from the first electrode 201 into the photoelectric conversion layer 205. The insulating layer 207 is arranged between the photoelectric conversion layer 205 and the second electrode 209.

As illustrated in FIG. 2, the first electrode 201 is electrically insulated every row. On the other hand, as illustrated in FIG. 5A, the first electrodes 201 of a plurality of pixels 100 included in one row are made of a common conductive member. Therefore, the first electrode 201 is also called a common electrode. Since the planar structure of the first electrode 201 is illustrated in FIG. 2, the first electrode 201 is not illustrated in FIG. 4.

As illustrated in FIGS. 4 and 5A, the second electrode 209 of each pixel 100 is electrically insulated from the second electrodes 209 of the other pixels 100. Therefore, the second electrode 209 is also called an individual electrode. The blocking layer 203, photoelectric conversion layer 205, and insulating layer 207 are continuously arranged in the plurality of pixels 100. Therefore, in FIG. 4, the blocking layer 203, photoelectric conversion layer 205, and insulating layer 207 are not illustrated in FIG. 4.

As illustrated in FIGS. 4, 5A, and 5B, the first capacitor 103 includes an upper electrode 211 and a lower electrode 213. The upper electrode 211 and the lower electrode 213 face each other with an insulating material interposed therebetween. According to such a configuration, a degree of design freedom of the capacitance value of the first capacitor 103 can be raised. This is because by using a semiconductor process such as lithography or the like, planar shapes of the upper electrode 211 and the lower electrode 213 can be simply determined. The first capacitor 103 may have another structure. As another example, a p-n junction capacitor having a capacitance value larger than a predetermined value may be used.

The upper electrode 211 and the lower electrode 213 of the first capacitor 103 are arranged in the interconnection layers below the second electrode 209 of the photoelectric conversion unit 101. When seeing as a plan view, the upper electrode 211 and the lower electrode 213 overlap with at least a part of the first electrode 201 or the second electrode 209. According to such a construction, a size of pixel 100 can be decreased. Each of the upper electrode 211 and the lower electrode 213 includes a portion which does not overlap with both of the reset transistor 102 and the amplifier transistor 104.

The first capacitor 103 of the present embodiment is, for example, an MIM (Metal Insulator Metal) capacitor. Specifically speaking, each of the upper electrode 211 and the lower electrode 213 is made of a conductive member such as a metal or the like. Or, the first capacitor 103 may be a PIP (Poly-Si Insulator Poly-Si) capacitor. Specifically speaking, each of the upper electrode 211 and the lower electrode 213 is made of polycrystalline silicon. Or, the first capacitor 103 may be an MOS (Metal Oxide Semiconductor) capacitor. Specifically speaking, the upper electrode 211 is made of a metal or a conductive member which shows a metallic property such as highly doped polycrystalline silicon or the like, and the lower electrode 213 is made of a semiconductor region.

As illustrated in FIGS. 5A and 5B, the second electrode 209 of the photoelectric conversion unit 101 is connected to the gate of the amplifier transistor 104 via a conductive member 219. The second electrode 209 of the photoelectric conversion unit 101 is also connected to the source region of the reset transistor 102 via the conductive member 219 and a conductive member 220. Further, the second electrode 209 is connected to the upper electrode 211 of the first capacitor 103 via the conductive member 219. The lower electrode 213 of the first capacitor 103 is connected to a semiconductor region 217 via a contact plug 215. The semiconductor region 217 is grounded.

The reset transistor 102 and the gate electrode of the amplifier transistor 104 are illustrated in FIG. 5B, respectively. A gate insulating film 230 is arranged between the gate electrode and the semiconductor substrate 200. The gate electrode of the select transistor 105 is connected to a driving signal line for transmitting the driving signal pSEL via a conductive member 221. The source region and the drain region of the pixel transistor are arranged in the semiconductor substrate 200. Since the semiconductor region 217 is grounded, the semiconductor region 217 and a well 240 in which the source regions and the drain regions of the foregoing transistors are arranged may be electrically connected.

A configuration of the photoelectric conversion unit 101 will be described in detail. The first electrode 201 of the photoelectric conversion unit 101 is made of a conductive member having high transmissivity of light. For example, a compound containing indium and/or tin such as ITO (Indium Tin Oxide) or a compound such as ZnO or the like is used as a material of the first electrode 201. According to such a configuration, a large quantity of light can be input to the photoelectric conversion layer 205. Therefore, a sensitivity can be improved. As another example, polycrystalline silicon or metal having such a thin thickness that a predetermined amount of light passes through it may be used as the first electrode 201. Since metal has a low electric resistance, an example in which metal is used as a material of the first electrode 201 is advantageous for realization of low electric power consumption or a high driving speed.

The blocking layer 203 blocks such a state that charges of the same conductivity type as that of the signal charges are injected from the first electrode 201 into the photoelectric conversion layer 205. The photoelectric conversion layer 205 is depleted by the voltage Vs which is applied to the first electrode 201. An inclination of a potential in the photoelectric conversion layer 205 is inverted in accordance with a relation between the voltage Vs which is applied to the first electrode 201 and the voltage of the second electrode 209 (node B). According to such a configuration, the accumulation of the signal charges and the removal of the accumulated signal charges can be performed. The operation of the photoelectric conversion unit 101 will be described hereinafter.

Specifically speaking, the photoelectric conversion layer 205 is made of intrinsic amorphous silicon (hereinafter, referred to as "a-Si"), p-type a-Si of a low concentration, n-type a-Si of a low concentration, or the like. Or, the photoelectric conversion layer 205 may be made of a compound semiconductor material. For example, a compound semiconductor material of the III-V group such as BN, GaAs, GaP, AlSb, GaAlAsP, or the like, a compound semiconductor material of the II-VI group such as CdSe, ZnS, HgTe, or the like, or a compound semiconductor material of the IV-VI group such as PbS, PbTe, CuO, or the like can be mentioned. Or, the photoelectric conversion layer 205 may be made of an organic material. For example, fullerene, coumarin 6 (C6), rhodamine 6G (R6G), zinc phthalocyanine (ZnPc), quinacridone, phthalocyanine system compound, naphthalocyanine system compound, or the like can be used. Further, a quantum dot film made of the foregoing compound semiconductor can be used as a photoelectric conversion layer 205.

If the photoelectric conversion layer 205 is made of a semiconductor material, it is desirable that an impurity concentration of the semiconductor is low or the semiconductor is intrinsic. According to such a configuration, since the depletion layer can be sufficiently spread into the photoelectric conversion layer 205, an effect of realization of a high sensitivity, noise reduction, and the like can be obtained.

As a blocking layer 203, the n-type or p-type semiconductor material of the same kind as that of the semiconductor material which is used in the photoelectric conversion layer 205, that is, the n-type or p-type semiconductor whose impurity concentration is higher than that of the semiconductor which is used in the photoelectric conversion layer 205 can be used. For example, if a-Si is used as a photoelectric conversion layer 205, n-type a-Si having high impurity concentration or p-type a-Si having high impurity concentration is used as a blocking layer 203. Since a position of a Fermi level differs in dependence on a difference of the impurity concentration, a potential barrier can be formed only to either the electrons or holes. A conductivity type of the blocking layer 203 is such a conductivity type that the charges of the conductivity type opposite to that of the signal charges become a majority carrier.

Or, the blocking layer 203 can be made of a material different from that of the photoelectric conversion layer 205. According to such a configuration, a heterojunction is formed. Since a band gap differs in dependence on a difference of the material, a potential barrier can be formed only to either the electrons or holes.

The insulating layer 207 is arranged between the photoelectric conversion layer 205 and the second electrode 209. An insulating material is used as an insulating layer 207. For example, an inorganic material such as silicon oxide, amorphous silicon oxide (hereinbelow, referred to as a-SiO), silicon nitride, amorphous silicon nitride (a-SiN), or the like, or an organic material is used as a material of the insulating layer 207. It is desirable that a thickness of insulating layer 207 is set to such a thickness that the charges do not pass through it due to a tunnel effect. According to such a configuration, since a leakage current can be reduced, noise can be decreased. Specifically speaking, it is desirable that the thickness of insulating layer 207 is set to 50 nm or more.

In the case where a-Si, a-SiO, or a-SiN is used for the blocking layer 203, photoelectric conversion layer 205, and insulating layer 207, dangling bonds may be terminated by hydrogen by executing a hydrogenating process. According to such a configuration, the noise can be reduced.

The second electrode 209 is made of a conductive member such as a metal or the like. The same material as the conductive member forming the interconnection or as the conductive member forming a pad electrode adapted to be connected to the outside is used for the second electrode 209. According to such a configuration, the second electrode 209 and the conductive member forming the interconnection or the pad electrode can be simultaneously formed. Therefore, a manufacturing process can be simplified.

Subsequently, the operation of the photoelectric conversion unit 101 in the photoelectric conversion device according to the present embodiment will be described. Each of FIGS. 6A to 6G schematically illustrates an energy band diagram in the photoelectric conversion unit 101. The energy bands of the first electrode 201, blocking layer 203, photoelectric conversion layer 205, insulating layer 207, and second electrode 209 are illustrated in FIGS. 6A to 6G. An axis of ordinate in FIGS. 6A to 6G indicates a potential to the electron. The potential to the electron is higher the upper side in FIG. 6A to FIG. 6G. The voltage is lower the upper side in FIG. 6A to FIG. 6G. With respect to each of the first electrode 201 and the second electrode 209, an energy level of the free electron is illustrated. With respect to each of the blocking layer 203 and the photoelectric conversion layer 205, an energy band gap between an energy level of a conduction band and an energy level of a valence band is illustrated. A potential of the photoelectric conversion layer 205 at an interface between the photoelectric conversion layer 205 and the insulating layer 207 is conveniently called a surface potential of the photoelectric conversion layer 205, or is simply called a surface potential.

As an operation of the photoelectric conversion unit 101, following steps (1) to (6) are repeatedly executed. Step (1) is a step of resetting an input node of the amplifier unit. Step (2) is a step of executing a readout of the noise signal N (N-signal read). Step (3) is a step of removing the signal charges from the photoelectric conversion unit (charge removing operation). Step (4) is a step of executing the readout of the light signal S (S-signal read). Step (5) is a step of performing a removal of the residual charges from the photoelectric conversion unit (charge removing operation) and a reset before the start of the accumulation of the signal charges. Step (6) is a step of performing the accumulation of the signal charges (accumulating operation). That is, in the present embodiment, the charge removing operation is executed multiple times between the first accumulating operation and the second accumulating operation which is executed after the first accumulating operation, the accumulating operation being executed multiple times including the first and second accumulating operations. In step (5), in the charge removing operation of a plurality of number of times, the resetting can be performed synchronously with the charge removing operation which is executed after the second time. Each of the foregoing steps will be described hereinbelow.

Figure 6A:
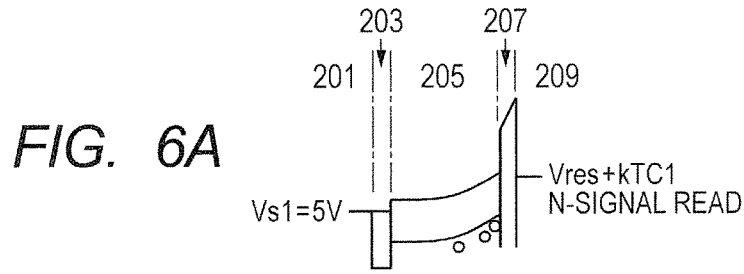
FIGS. 6A, 6B, 6C, 6D, 6E, 6F and 6G are diagrams each schematically illustrating a potential distribution of a photoelectric conversion unit of the photoelectric conversion device according to the first embodiment.

FIG. 6A illustrates a state of the photoelectric conversion unit 101 in steps (1) and (2). The first voltage Vs1 is supplied from the voltage supply unit 110 to the first electrode 201. The first voltage Vs1 is, for example, 5 V. The holes illustrated by white circles are accumulated in the photoelectric conversion layer 205 as signal charges generated during the exposure period of time. The surface potential of the photoelectric conversion layer 205 changes in such a direction that it decreases (such a direction that the voltage increases) in accordance with an amount of holes which are accumulated. When the electrons are accumulated, the surface potential changes in such a direction that it increases (such a direction that the voltage decreases) in accordance with an amount of electrons which are accumulated.

The reset transistor 102 is turned on in this state. Thus, the voltage of the node including the second electrode 209, that is, the node B in FIG. 1A is reset to the reset voltage Vres (hereinbelow, such a reset operation is called an "FD reset"). In the present embodiment, the gate of the amplifier transistor 104 is included in the node B. Therefore, the voltage of the gate of the amplifier transistor 104 is reset. The reset voltage Vres is, for example, 3.3 V.

After that, the reset transistor 102 is turned off. Thus, the node B enters an electrical floating state. At this time, reset noise (noise kTC1 in FIGS. 6A to 6C) by the reset transistor 102 may be generated.

The surface potential of the photoelectric conversion layer 205 can change in accordance with the change in voltage of the second electrode 209 caused by the reset operation. A changing direction of the voltage of the second electrode 209 at this time is a direction opposite to that of the change in voltage of the second electrode 209 caused by the accumulation of the signal charges. Therefore, the holes of the signal charges are held in a state where they are accumulated in the photoelectric conversion layer 205. Since the injection of the holes from the first electrode 201 is blocked by the blocking layer 203, the amount of signal charges accumulated in the photoelectric conversion layer 205 does not change.

If the select transistor 105 is ON, the amplifier transistor 104 outputs the noise signal N containing the reset noise (Vres+ktC1) from the pixel 100 (N-signal read). The noise signal N is held in the capacitor CTN of the column circuit 140.

Figure 6B:
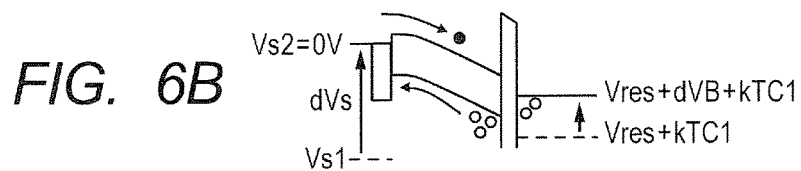
Figure 6C:
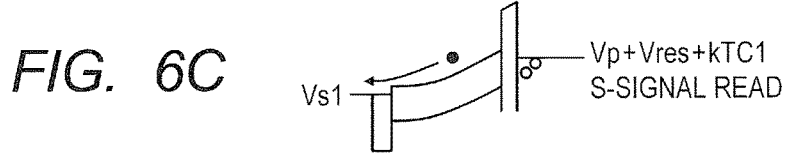

FIGS. 6B and 6C illustrate states of the photoelectric conversion unit 101 in step (3). First, the second voltage Vs2 is supplied to the first electrode 201. Since the holes are used as signal charges, the second voltage Vs2 is lower than the first voltage Vs1. The second voltage Vs2 is, for example, 0 V.

At this time, the voltage of the second electrode 209 (node B) changes in the same direction as the changing direction of the voltage of the first electrode 201. A change amount dVB of the voltage of the second electrode 209 is determined in accordance with a ratio between a capacitance value C1 of the first capacitor 103 connected to the second electrode 209 and a capacitance value C2 of the second capacitor 111 which the photoelectric conversion unit 101 has. The change amount dVB of the voltage of the second electrode 209 to a change amount dVs of the voltage of the first electrode 201 is expressed by $dVB=dVs\times C2/(C1+C2)$. The node B including the second electrode 209 can contain other capacitive components. However, the other capacitive components are sufficiently smaller than the capacitance value C1 of the first capacitor 103. Therefore, it may be regarded that the capacitance value of the node B is equal to the capacitance value C1 of the first capacitor 103.

In the present embodiment, the change amount dVs of the voltage of the first electrode 201 is sufficiently larger than the change amount dVB of the voltage of the second electrode 209. Therefore, the potential of the second electrode 209 is lower than the potential of the first electrode 201 and an inclination of the potential in the photoelectric conversion layer 205 is inverted. Therefore, the electrons illustrated by black circles are injected from the first electrode 201 into the photoelectric conversion layer 205. A part or all of the holes accumulated in the photoelectric conversion layer 205 as signal charges are moved to the blocking layer 203. The moved holes are recombined with the majority carriers in the blocking layer 203 and are extinguished. Thus, the holes in the photoelectric conversion layer 205 are removed from the photoelectric conversion layer 205. If the whole photoelectric conversion layer 205 is depleted, all of the holes accumulated as signal charges are removed.

Subsequently, in the state illustrated in FIG. 6C, the first voltage Vs1 is supplied to the first electrode 201. Thus, the inclination of the potential in the photoelectric conversion layer 205 is inverted again. Therefore, the electrons injected into the photoelectric conversion layer 205 in the state of FIG. 6B are removed from the photoelectric conversion layer 205. The blocking layer 203 blocks the injection of the holes from the first electrode 201 into the photoelectric conversion layer 205. Therefore, the surface potential of the photoelectric conversion layer 205 changes in accordance with the amount of accumulated holes. In correspondence to the change in surface potential, the voltage of the second electrode 209 changes by an amount of a voltage Vp according to the amount of extinguished holes from the reset state. That is, the voltage Vp according to the amount of holes accumulated as signal charges appears in the node B. The voltage Vp according to the amount of accumulated holes is called a light signal component.

The select transistor 105 is turned on in the state illustrated in FIG. 6C. Thus, the amplifier transistor 104 outputs the light signal S (Vp+Vres+kTC1) from the pixel 100 (S-signal read). The light signal S is held in the capacitor CTS of the column circuit 140. A difference between the reset signal (Vres+kTC1) which is read out in step (2) and the light signal S (Vp+Vres+kTC1) which is read out in step (4) is a signal (light signal component) based on the voltage Vp according to the accumulated signal charges.

Figure 6D:
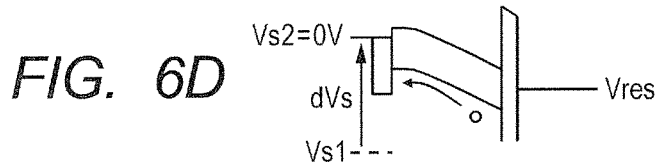
Figure 6E:
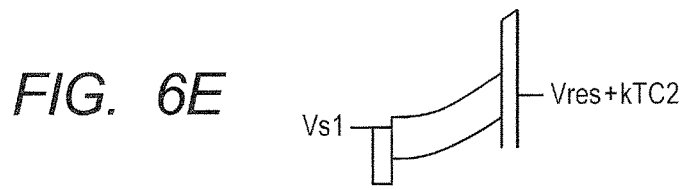

FIGS. 6D and 6E illustrate states of the photoelectric conversion unit 101 in step (5). The reset transistor 102 is turned on and the voltage of the node B is reset to the reset voltage Vres (FD reset). At the same time, in a manner similar to FIG. 6B, the voltage applied to the first electrode 201 is changed from the first voltage Vs1 to the second voltage Vs2 and, further, from the second voltage Vs2 to the first voltage Vs1. By swinging the voltage applied to the first electrode 201 as mentioned above, all of the photo-induced charges in the photoelectric conversion layer 205 can be removed (hereinbelow, such a removal of the photo-induced charges is referred to as a "film reset"). Dark charges and photo-induced charges (in the present embodiment, the light is always irradiated) accumulated in the photoelectric conversion layer 205 for a period of time from FIG. 6C to the reset before the start of the accumulation are contained in the photo-induced charges which are removed. The photo-induced charges which remain in the photoelectric conversion layer 205 without being perfectly read out in the charge removing step in FIG. 6B are also contained. Thus, such a situation that the residual charges or the like of the previous frame exert an influence on the light signal component of the next frame can be prevented.

After that, the reset transistor 102 is turned off. As mentioned above, by resetting the node B before the start of the accumulation of the signal charges, the light signal component of the previous frame accumulated in the node B can be eliminated. Such a situation that the light signal component is successively accumulated in the node B and a dynamic range is narrowed can be prevented.

Also at this time, reset noise (noise kTC2 in FIGS. 6E and 6G) due to the reset transistor 102 may be generated.

However, the reset noise which is generated here can be eliminated by executing the reset operation of step (1) after the end of the accumulating period of time.

Figure 6F:
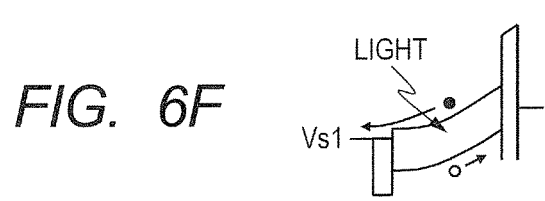
Figure 6G:
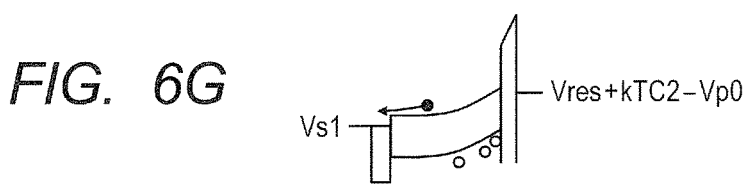

FIGS. 6F and 6G illustrate states of the photoelectric conversion unit 101 in step (6). The first voltage Vs1 is supplied to the first electrode 201 and the reset voltage Vres is supplied to the node B. Since the reset voltage Vres is lower than the first voltage Vs1, the electrons in the photoelectric conversion layer 205 are removed to the first electrode 201. On the other hand, the holes in the photoelectric conversion layer 205 are moved toward the interface between the photoelectric conversion layer 205 and the insulating layer 207. However, since the holes cannot be moved to the insulating layer 207, they are accumulated in the photoelectric conversion layer 205. As mentioned above, the blocking layer 203 blocks such a state that the holes are injected into the photoelectric conversion layer 205. Therefore, if the light enters the photoelectric conversion layer 205 in this state, only the holes in the electron-hole pairs generated by the photoelectric conversion are accumulated as signal charges in the photoelectric conversion layer 205. After the accumulation is performed for a predetermined period of time, the operations of steps (1) to (6) are repeated.

The surface potential of the photoelectric conversion layer 205 changes by the accumulated holes. The voltage of the second electrode 209 rises in accordance with such a change in surface potential. Such a voltage is illustrated by a voltage Vp0 in FIG. 6G. At the time of resetting in FIG. 6A, as mentioned above, the voltage of the second electrode 209 changes so as to set off the changed voltage Vp0. That is, the voltage of the second electrode 209 decreases. Therefore, the surface potential of the photoelectric conversion layer 205 changes in such a direction that it rises.

If the signal charges are the electrons, the second voltage Vs2 is higher than the first voltage Vs1. Therefore, the inclination of the potential in FIGS. 6A to 6G is inverted. Other operations are substantially the same as those in the foregoing case.

An effect of the noise reduction in the present embodiment will now be described. In the operations described with reference to FIGS. 6A to 6G, since the inclination of the potential in the photoelectric conversion layer 205 is inverted in the state of FIG. 6B, the accumulated signal charges are removed. If the inclination of the potential in the photoelectric conversion layer 205 cannot be inverted, the charges which are not removed are generated, so that there is a possibility of occurrence of noise. As the change amount dVs of the voltage of the first electrode 201 is larger than the change amount dVB of the voltage of the second electrode 209 (node B), it is liable to invert the inclination of the potential. In other words, as the change amount dVs of the voltage of the first electrode 201 is larger than the change amount dVB of the voltage of the second electrode 209, the noise can be reduced.

As mentioned above, there is a relation of (dVB=dVs× C2/(C1+C2)) between the change amount dVs of the voltage of the first electrode 201 and the change amount dVB of the voltage of the node B. By modifying the equation, the change amount dVs of the voltage of the first electrode 201 is expressed as (dVs=dVB+(C1/C2)×dVB). That is, the change amount dVs of the voltage of the first electrode 201 is larger than the change amount dVB of the voltage of the second electrode 209 by an amount of (C1/C2)×dVB. Therefore, the larger the capacitance value C1 of the node B is, the difference between the change amount dVs of the voltage of the first electrode 201 and the change amount dVB of the voltage of the second electrode 209 increases.

In the present embodiment, the first capacitor 103 is connected to the second electrode 209. Therefore, the capacitance value C1 of the node B can be increased. According to such a configuration, the change amount dVs of the voltage of the first electrode 201 can be set to a value larger than the change amount dVB of the voltage of the second electrode 209. Thus, since the photoelectric conversion layer 205 can be easily depleted, the charges which are not removed can be reduced. As mentioned above, according to the present embodiment, the noise can be decreased.

As a comparison, a configuration in which the first capacitor 103 is not connected to the node B will be described. In this case, a capacitance of the node B may contain a capacitive component due to a p-n junction of the semiconductor region and a parasitic capacitive component with the interconnections. However, those capacitive components are so small that they can be ignored as compared with the capacitance value C2 of the second capacitor 111 which the photoelectric conversion unit 101 has. Therefore, a value of C1/C2 is almost zero. Thus, when the second voltage Vs2 is supplied to the first electrode 201, the change amount dVs of the voltage of the first electrode 201 and the change amount dVB of the voltage of the second electrode 209 are almost equal. Therefore, in the state of FIG. 6B, there is a possibility that the inclination of the potential is not inverted. As a result, a possibility that a part of the holes accumulated as signal charges cannot be removed occurs. As compared with the comparison, since an amount of signal charges which are not removed can be reduced in the present embodiment, the noise can be decreased.

Subsequently, a relation among the capacitance value C1 of the first capacitor 103, the capacitance value C2 of the second capacitor 111 included in the photoelectric conversion unit 101, and the voltage which is supplied to each unit will be described.

In the present embodiment, the photoelectric conversion unit 101 includes the blocking layer 203, the photoelectric conversion layer 205, and the insulating layer 207. An electric conductivity of the blocking layer 203 is higher than those of the photoelectric conversion layer 205 and the insulating layer 207. Therefore, the capacitance value C2 of the second capacitor 111 included in the photoelectric conversion unit 101 is equal to a synthetic capacitance of a capacitive component Ci of the photoelectric conversion layer 205 and a capacitive component Cins of the insulating layer 207. Specifically speaking, the capacitance value C2 of the second capacitor 111 is expressed by the following equation (1).

$$C2 = Ci \times Cins/(Ci+Cins) \quad (1)$$

Where, it is assumed that an area of the second electrode 209 when seen as a plan view is Ss, a thickness of the photoelectric conversion layer 205 is di, a thickness of the insulating layer 207 is dins, a dielectric constant of the photoelectric conversion layer 205 is Ei, a dielectric constant of the insulating layer 207 is Eins, and a dielectric constant of the vacuum is E0, respectively. The capacitive component Ci and the capacitive component Cins are expressed by the following equations (2) and (3).

$$Ci = E0 \times Ei \times Ss/di \quad (2)$$

$$Cins = E0 \times Eins \times Ss/dins \quad (3)$$

Since a fringe electric field of the second electrode 209 can be substantially ignored, as an area which is used in the calculations of the capacitances, it is sufficient to merely consider only the area Ss of the second electrode 209 when seen as a plan view. The area Ss of the second electrode 209 when seen as a plan view is, for example, an area of the second electrode 209 in FIG. 4. The thickness di of the photoelectric conversion layer 205 and the thickness dins of the insulating layer 207 are illustrated in FIGS. 5A and 5B.

Assuming that an area of the upper electrode 211 or the lower electrode 213 when seen as a plan view is Sd, a distance between the upper electrode 211 and the lower electrode 213 is dd, and a dielectric constant of an insulating layer between the upper electrode 211 and the lower electrode 213 is Ed, the capacitance value C1 of the first capacitor 103 is expressed by the following equation (4).

$$C1 = E0 \times Ed \times Sd/dd \quad (4)$$

In the present embodiment, by controlling a voltage Vs of the first electrode 201 (node A) to the first voltage Vs1 and the second voltage Vs2, the accumulation of the signal charges and the removal of the signal charges due to the depletion of the photoelectric conversion layer 205 are performed. If the capacitance value C1 of the first capacitor 103 and the capacitance value C2 of the second capacitor 111 satisfy a relation, which will be described hereinafter, at the time of the removal of the signal charges mentioned above, the charges remaining in the photoelectric conversion layer 205 can be effectively reduced. First, a description will be made with respect to the case where the signal charges are the holes.

For simplicity of description, it is assumed hereinbelow that the capacitance value C1 of the first capacitor 103 is k times as large as the capacitance value C2 of the second capacitor 111. That is, the capacitance value C1 and the capacitance value C2 have a relation expressed by the following equation (5).

$$C1 = k \times C2 \quad (5)$$

As mentioned above, the change amount dVs of the voltage of the first electrode 201 and the change amount dVB of the voltage of the second electrode 209 (node B) have a relation expressed by the following equation (6).

$$dVB = dVs \times C2/(C1+C2) \quad (6)$$

The following equation (7) is obtained from the equations (5) and (6).

$$dVB = dVs/(1+k) \quad (7)$$

In order to accumulate the holes as signal charges here, it is sufficient that the first voltage Vs1 and the reset voltage Vres satisfy a relation expressed by the following expression (8).

$$Vs1 > Vres \quad (8)$$

In order to transfer the holes of the signal charges, it is sufficient that the first voltage Vs1, the reset voltage Vres, the change amount dVs of the voltage of the first electrode 201, and the change amount dVB of the voltage of the second electrode 209 satisfy a relation expressed by the following expression (9).

$$Vs1 + dVs < Vres + dVB \quad (9)$$

When the relation of the expression (8) is satisfied, the inclination of the potential adapted to allow the holes to drift toward the insulating layer 207 can be formed in the photoelectric conversion layer 205. When the relation of the expression (9) is satisfied, the inclination of the potential in the photoelectric conversion layer 205 can be easily inverted.

The following expression (10) is obtained from the equation (7) and the expression (9).

$$Vs1 - Vres + dVs < dVs/(1+k) \quad (10)$$

Where, since k>0, by multiplying both sides of the expression (10) by (1+k), the expression (10) is modified to the following expression (11).

$$(1+k) \times (Vs1 - Vres + dVs) < dVs \quad (11)$$

Where, the change amount dVs of the voltage of the first electrode 201 is expressed by (dVs=Vs2−Vs1). Therefore, (Vs1−Vres+dVs=Vs2−Vres). In the example in which the signal charges are the holes, the reset voltage Vres is higher than the second voltage Vs2. That is, Vs2−Vres<0. Thus, a relation expressed by the following expression (12) is satisfied.

$$Vs1 - Vres + dVs < 0 \quad (12)$$

Therefore, by dividing both sides of the expression (11) by (Vs1−Vres+dVs), the direction of the inequality is changed and a relation expressed by the following expression (13) is obtained.

$$1 + k > dVs/(Vs1 - Vres + dVs) \quad (13)$$

From the expression (13), a relation expressed by the following expression (14) is obtained with respect to a capacitance ratio k between the capacitance values C1 and C2.

$$k > dVs/(Vs1 - Vres + dVs) - 1 \quad (14)$$

If the relation of the expression (14) is satisfied, the amount of charges which are not removed can be reduced. Therefore, the noises can be decreased.

In the present embodiment, the first voltage Vs1 is 5 V and the reset voltage Vres is 3.3 V. Since the second voltage Vs2 is 0 V, the change amount dVs of the voltage of the first electrode 201 is −5 V. Therefore, a value of k is set to a value larger than 0.52. Specifically speaking, in the present embodiment, the capacitance value C1 of the first capacitor 103 is 4 fF and the capacitance value C2 of the second capacitor 111 is 1 fF. That is, k=4. According to such a configuration, the noise can be further reduced.

In the present embodiment, when seen as a plan view, the area Sd of the upper electrode 211 or the lower electrode 213 of the first capacitor 103 and the area Ss of the second electrode 209 satisfy a relation of Sd>0.5×Ss. According to such a configuration, the foregoing relation of the capacitance ratio can be easily obtained.

The larger the value of k is, the larger the effect of the noise reduction is. Therefore, when the capacitance value C1 of the first capacitor 103 is equal to or larger than the capacitance value C2 of the second capacitor 111, the effect of the noise reduction can be further raised.

The change amount dVs of the voltage of the first electrode 201 is expressed by (dVs=Vs2−Vs1) by using the first voltage Vs1 and the second voltage Vs2. Therefore, the expression (14) is modified to the following expression (15).

$$k > (Vs2 - Vs1)/(Vs2 - Vres) - 1 \quad (15)$$

Particularly, when the second voltage Vs2 is 0 V, the expression (15) can be simplified to the following expression (16).

$$k > Vs1/Vres - 1 \quad (16)$$

Subsequently, a case where the signal charges are the electrons will be described. When the signal charges are the electrons, the direction of the inequality of each of the expressions (8) and (9) changes. Therefore, the direction of the inequality of each of the expressions (10) and (11) also changes. However, when the signal charges are the electrons, the reset voltage Vres is lower than the second voltage Vs2. Therefore, (Vs1−Vres+dVs=Vs2−Vres) in the expression (11) is a positive value. That is, a relation of ((Vs1−Vres+dVs)>0) is satisfied. Therefore, when both sides of the expression (11) are divided by (Vs1−Vres+dVs), the direction of the inequality is not changed. Consequently, the expressions (14) and (15) are obtained in a manner similar to the case where the signal charges are the holes.

The left side of the expression (15) can be rewritten to C1/C2 by using the equation (5). Since ((Vs2−Vres)/(Vs2−Vres)=1), by reducing the right side of the expression (15), the following expression (17) is obtained.

$$C1/C2 > (Vres-Vs1)/(Vs2-Vres) \qquad (17)$$

A relation shown by the expression (17) will now be described. First, the reset voltage Vres is equal to an intermediate value between the first voltage Vs1 and the second voltage Vs2.

The more the reset voltage Vres is close to the first voltage Vs1, a value of the right side is small. That is, even if the capacitance value C1 of the first capacitor 103 is small, the inclination of the potential in the photoelectric conversion layer 205 can be inverted. When a difference between the reset voltage Vres and the first voltage Vs1 is small, an amount of charges which can be accumulated in the photoelectric conversion layer 205 is small.

On the other hand, the more the reset voltage Vres is close to the second voltage Vs2, a value of the right side is large. That is, a large value is used as a capacitance value C1 of the first capacitor 103. At this time, since the difference between the reset voltage Vres and the first voltage Vs1 is large, an amount of charges which can be accumulated in the photoelectric conversion layer 205 can be increased.

In order to obtain a good balance between a saturation charge amount and the capacitance value C1 of the first capacitor 103, it is desirable that the reset voltage Vres lies within a range of 20% to 80% of a range in the case where the first voltage Vs1 is set to an upper limit (or a lower limit) and the second voltage Vs2 is set to a lower limit (or an upper limit). For example, when the first voltage Vs1 is 5 V and the second voltage Vs2 is 0 V, it is desirable that the reset voltage Vres lies within a range of 1 V to 4 V.

If the photoelectric conversion device is used as an image sensor of a camera or the like, a low power supply voltage is used in order to realize low electric power consumption. For example, in many cases, the power supply voltage which is applied to the image sensor is equal to or less than 5 V. Therefore, a voltage of 5 V or less is also used as each voltage shown in the expressions (14) to (17). In such a case, if the capacitance value C1 of the first capacitor 103 and the capacitance value C2 of the second capacitor 111 satisfy the foregoing relation, the noise can be reduced while driving the photoelectric conversion device by a low voltage. In the present embodiment, the reset voltage Vres and the power supply voltage Vdd are supplied from the same power source and are set to, for example, 3.3 V. However, the reset voltage Vres and the power supply voltage Vdd can be also set to different voltages. In the configuration illustrated in FIG. 4, a supply line of the reset voltage Vres and a supply line of the power supply voltage Vdd are a common line in the pixel unit. In this case, when resetting, a voltage supply source (not illustrated) applies the reset voltage Vres to the power supply line Vdd/Vres. When the signal is read out of the amplifier transistor 104, the voltage supply source applies a desired power supply voltage Vdd different from the reset voltage Vres to the power supply line Vdd/Vres.

As described above, the noise can be reduced by the relation between the capacitance value C1 of the first capacitor 103 and the capacitance value C2 of the second capacitor 111 included in the photoelectric conversion unit 101.

The numerical values mentioned above are merely an example and the present invention is not limited to those values. There is a possibility that a defect level or the like exists at an interface between the photoelectric conversion layer 205 and the insulating layer 207. In such a case, it is sufficient to consider a flat band voltage on the basis of the prior arts.

Figure 7:
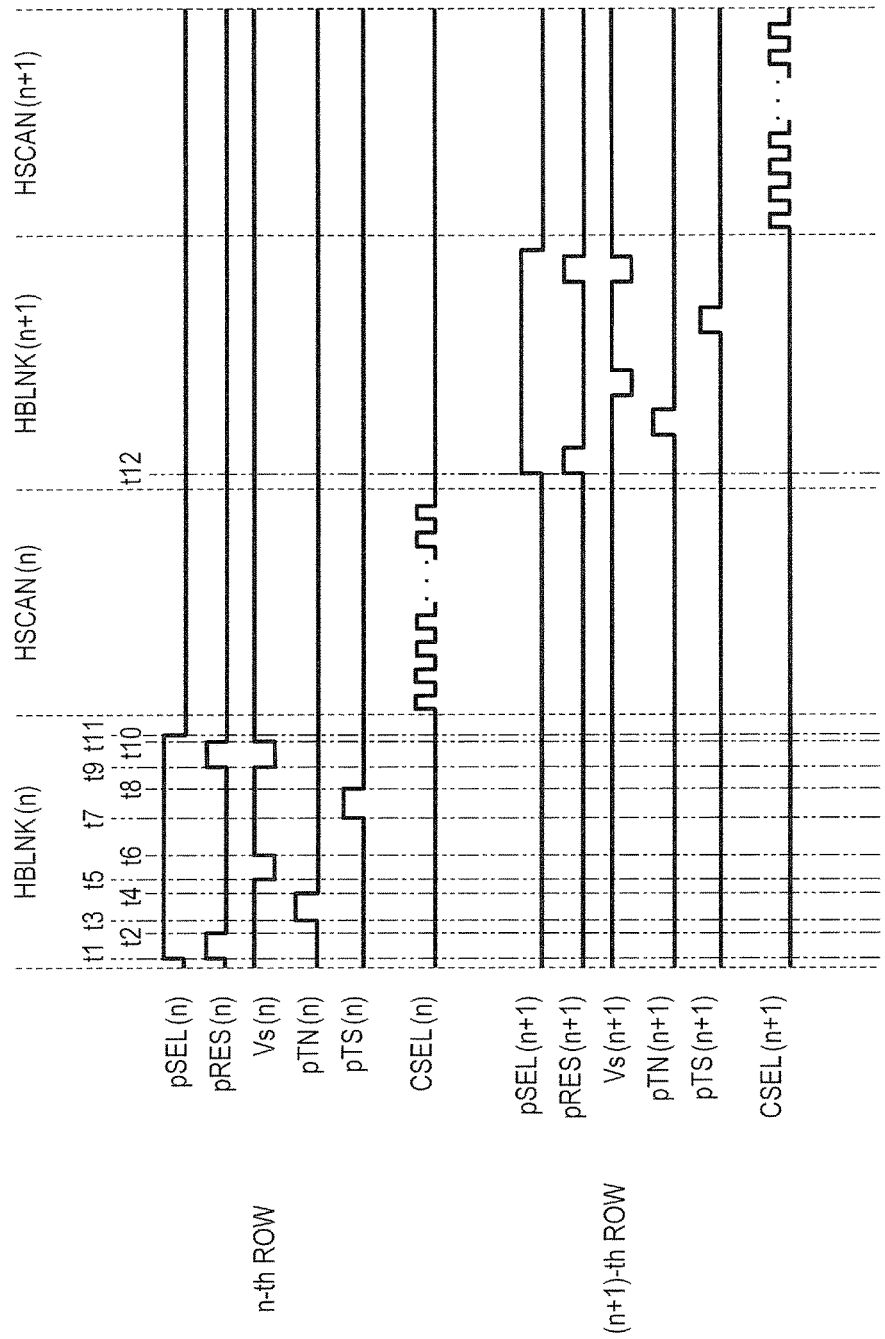
FIG. 7 is a diagram illustrating a timing chart of driving signals which are used in the photoelectric conversion device according to the first embodiment.

Subsequently, a method of driving the photoelectric conversion device according to the present embodiment will be described. FIG. 7 illustrates a timing chart of driving signals which are used in the photoelectric conversion device of the present embodiment. The driving signals corresponding to the readout operation of the signals of two rows of the n-th row and the (n+1)-th row are illustrated in FIG. 7.

The driving signal pSEL is supplied to the gate of the select transistor 105. The driving signal pRES is supplied to the gate of the reset transistor 102. The voltage signal Vs is supplied to the first electrode 201 of the photoelectric conversion unit 101. The driving signal pTS is supplied to the S/H switch 303. The driving signal pTN is supplied to the S/H switch 305. The driving signal CSEL is supplied to the column circuit 140.

When the driving signals pSEL, pRES, pTN, and pTS are at the high level, the corresponding transistors or switches are on-state. When the driving signals pSEL, pRES, pTN, and pTS are at the low level, the corresponding transistors or switches are off-state. The voltage signal Vs includes the first voltage Vs1 and the second voltage Vs2.

In the driving of the photoelectric conversion device of the present embodiment, what is called a rolling shutter operation is executed. Before time t1, the photoelectric conversion unit 101 of the pixel 100 of the n-th row and the photoelectric conversion unit 101 of the pixel 100 of the (n+1)-th row are in a state where the signal charges are being accumulated. Before time t1, both of a voltage signal Vs(n) of the n-th row and a voltage signal Vs(n+1) of the (n+1)-th row are the first voltage Vs1.

At time t1, a driving signal pSEL(n) is set to the high level and the select transistor 105 of the pixel 100 of the n-th row is turned on. Thus, the amplifier transistor 104 of the pixel 100 of the n-th row outputs the signal.

At time t1, a driving signal pRES(n) is set to the high level and the reset transistor 102 of the pixel 100 of the n-th row is turned on. Thus, the voltage of the node B of the pixel 100 of the n-th row is reset to the reset voltage Vres. After that, at time t2, the driving signal pRES(n) is set to the low level and the reset transistor 102 is turned off. A state of the energy band of the photoelectric conversion unit 101 at this time is illustrated in FIG. 6A.

Subsequently, a driving signal pTN(n) is set to the high level at time t3 and is set to the low level at time t4. Thus, the noise signal N containing the reset noise (kTC1 in FIGS. 6A to 6C) is held in the capacitor CTN of the column circuit 140.

At time t5, the voltage signal Vs(n) is shifted from the first voltage Vs1 to the second voltage Vs2. A state of the energy band of the photoelectric conversion unit 101 at this time is illustrated in FIG. 6B. Subsequently, at time t6, the voltage signal Vs(n) is shifted from the second voltage Vs2 to the first voltage Vs1. A state of the energy band of the photoelectric conversion unit 101 at this time is illustrated in FIG. 6C. By the operation which is executed for a period of time between time t5 and time t6, the signal charges are transferred as mentioned above. Therefore, the voltage Vp corresponding to the amount of the accumulated signal charges is generated in the node B.

The driving signal pTS(n) is set to the high level at time t7 and is set to the low level at time t8. Thus, the light signal S containing the voltage Vp and the reset noises (kTC1 in FIGS. 6A to 6C) is held in the capacitor CTS of the column circuit 140.

Subsequently, the driving signal pRES(n) is set to the high level at time t9 and the voltage signal Vs (n) is shifted from the first voltage Vs1 to the second voltage Vs2. A state of the energy band of the photoelectric conversion unit 101 at this time is illustrated in FIG. 6D. Thus, the node B is reset by the reset voltage (FD reset) and, at the same time, all of the charges remaining in the photoelectric conversion layer 205 are removed, thereby performing the film reset. At time t10, the driving signal pRES(n) is set to the low level and the voltage signal Vs(n) is shifted from the second voltage Vs2 to the first voltage Vs1. A state of the energy band of the photoelectric conversion unit 101 at this time is illustrated in FIG. 6E. Thus, the voltage of the node B of the pixel 100 of the n-th row is again reset to the reset voltage Vres.

After that, the pixel 100 of the n-th row starts the accumulation of the signal charges of the next frame. A state of the energy band of the photoelectric conversion unit 101 during the accumulation of the signal charges is illustrated in FIGS. 6F and 6G.

At time t11, the driving signal pSEL(n) is set to the low level and the readout of the signal from the pixel 100 of the n-th row to the column circuit 140 is finished.

The noise signal N and the light signal S which are read out to the column circuit 140 are output to the output unit 170 every column in response to the driving signal CSEL. The output unit 170 outputs a difference between the light signal S and the noise signal N to the A/D conversion unit 180.

At time t12, a driving signal pSEL(n+1) is set to the high level and the select transistor 105 of the pixel 100 of the (n+1)-th row is turned on. After that, the readout of the signal from the pixel 100 of the (n+1)-th row is performed. Since such an operation is similar to the operation which is executed for a period of time between time t1 and time t11, its description is omitted here.

As mentioned above, the photoelectric conversion device of the present embodiment includes the node B which is electrically connected to the second electrode 209 of the photoelectric conversion unit 101 and is configured so as to enter an electrical floating state. The first capacitor 103 is connected to the node B. According to such a configuration, the photoelectric conversion layer 205 of the photoelectric conversion unit 101 can be easily depleted. Thus, the noise can be reduced. By executing the charge removing operation (film reset) from the photoelectric conversion layer after the light signal S is read out, all of the photo-induced charges remaining in the photoelectric conversion layer can be removed. Thus, such a situation that the residual charges or the like of the previous frame exert an influence on the light signal component of the next frame can be prevented.

Second Embodiment

A photoelectric conversion device according to a second embodiment of the present invention will be described with reference to FIGS. 8 to 13.

The photoelectric conversion device according to the present embodiment differs from the photoelectric conversion device according to the first embodiment with respect to a node to which the voltage supply unit supplies a voltage. In the present embodiment, portions different from those in the first embodiment will be mainly described and a description of substantially the same portions as those in the first embodiment is properly omitted here.

Figure 8:
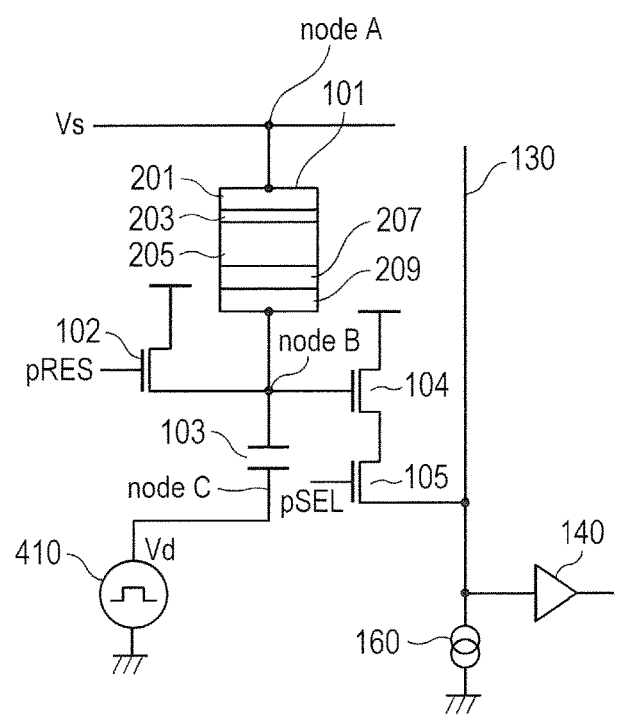
FIG. 8 is a diagram schematically illustrating a configuration of a pixel of a photoelectric conversion device according to a second embodiment.

FIG. 8 schematically illustrates a configuration of the pixel 100 of the photoelectric conversion device according to the present embodiment. Portions having substantially the same functions as those in FIG. 1A are designated by the same reference numerals. An equivalent circuit of the photoelectric conversion unit 101 of the present embodiment is substantially the same as that in the first embodiment. That is, FIGS. 1B and 1C illustrate the equivalent circuits of the photoelectric conversion unit 101 of the present embodiment.

In the present embodiment, a voltage Vd from the voltage supply unit 410 is supplied to the second terminal of the first capacitor 103. The voltage supply unit 410 supplies at least a first voltage Vd1 and a second voltage Vd2 different from the first voltage Vd1 to the second terminal of the first capacitor 103.

When the signal charges are the holes, the second voltage Vd2 is higher than the first voltage Vd1. When the signal charges are the holes, for example, the first voltage Vd1 is 0 V and the second voltage Vd2 is 5 V. When the signal charges are the electrons, the second voltage Vd2 is lower than the first voltage Vd1. When the signal charges are the electrons, for example, the first voltage Vd1 is 5 V and the second voltage Vd2 is 0 V.

On the other hand, a predetermined voltage Vs is supplied to the first electrode 201 of the photoelectric conversion unit 101. In the present embodiment, a voltage of 3 V is supplied to the first electrode 201 of the photoelectric conversion unit 101. In FIG. 1A, the node A is included in the first electrode 201.

Subsequently, the reset voltage Vres which is supplied by the reset transistor 102 will be described. When the signal charges are the holes, the reset voltage Vres is lower than the voltage Vs which is supplied to the first electrode 201 of the photoelectric conversion unit 101. When the signal charges are the electrons, the reset voltage Vres is higher than the voltage Vs which is supplied to the first electrode 201 of the photoelectric conversion unit 101.

In the present embodiment, by controlling the voltage Vd of the node C, the voltage of the node B connected to the node C via the first capacitor 103 is controlled. Therefore, a direct-current-like magnitude relation between the voltage Vd which is supplied to the node C and the reset voltage Vres or the voltage Vs which is supplied to the node A is not particularly limited.

Figure 9:
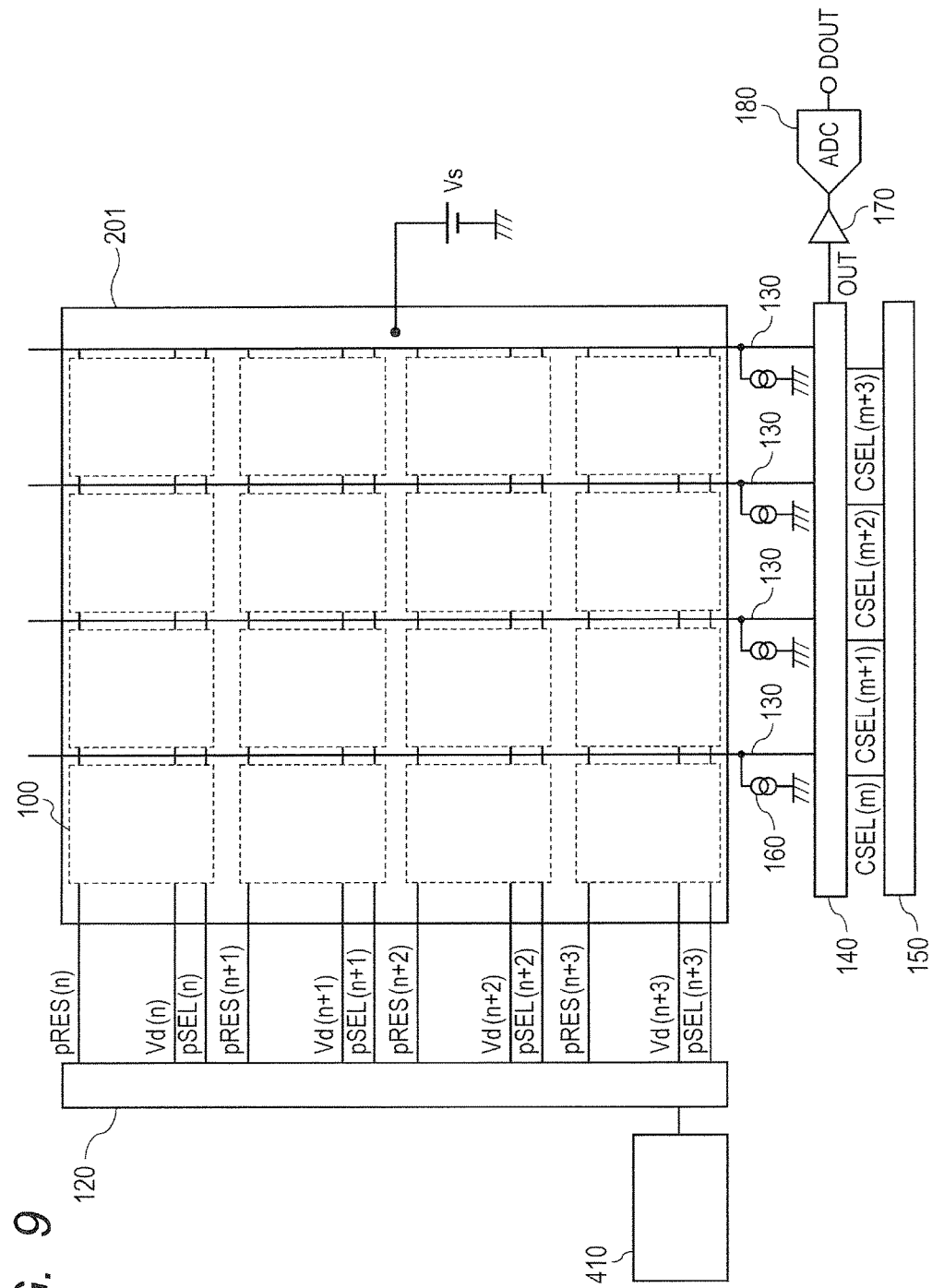
FIG. 9 is a diagram schematically illustrating a general configuration of the photoelectric conversion device according to the second embodiment.

FIG. 9 is a diagram schematically illustrating a general circuit configuration of the photoelectric conversion device of the present embodiment. Portions having substantially the same functions as those in FIG. 2 are designated by the same reference numerals.

FIG. 9 schematically illustrates a planar structure of the first electrode 201 of the photoelectric conversion unit 101. The first electrode 201 is included in the node A in FIG. 8. As illustrated in FIG. 9, the photoelectric conversion units 101 of a plurality of pixels 100 included in a plurality of rows and a plurality of columns are configured so as to include the common first electrode 201. The voltage Vs is supplied to the first electrode 201.

In the present embodiment, the voltage Vd which is supplied to the second terminal (node C) of the first capacitor 103 is independently controlled every row. Therefore, the row driving circuit 120 selects the row to which the voltage Vd is supplied from the voltage supply unit 410. In order to distinguish the voltages Vd which are supplied to the different rows, reference characters such as (n), (n+1), and the like showing the rows are added to them. According to the above-described configuration, in the present embodiment, a plurality of pixels 100 can be driven every row.

A configuration of the column circuit 140 in the present embodiment is substantially the same as that in the first embodiment. That is, FIG. 3 illustrates an equivalent circuit of the column circuit 140 of the present embodiment. In a manner similar to the first embodiment, the column circuit 140 may be an analog/digital (A/D) conversion circuit. In this case, the A/D conversion circuit includes a holding unit such as memory, counter, or the like for holding a digital signal. Each of the noise signal N and the light signal S is converted into a digital signal and is held.

Figure 10:
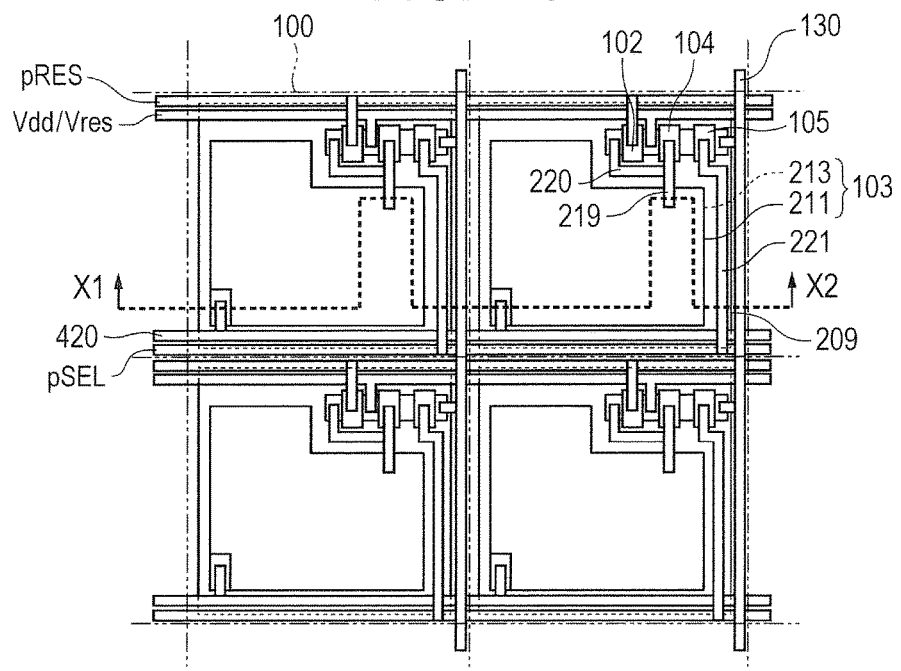
FIG. 10 is a diagram schematically illustrating a planar structure of the photoelectric conversion device according to the second embodiment.
Figure 11:
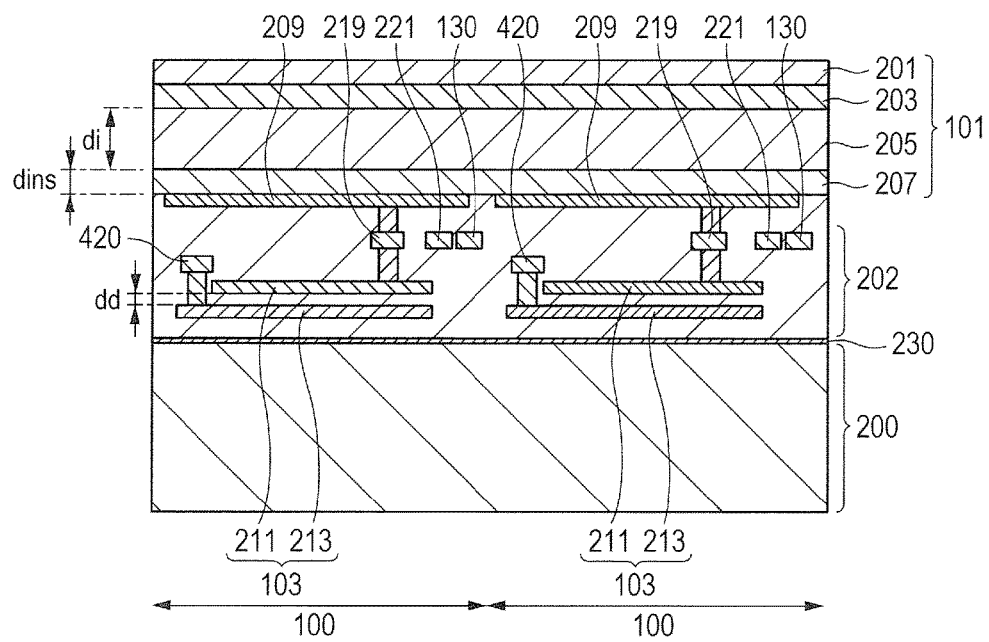
FIG. 11 is a diagram schematically illustrating a cross-sectional structure of the photoelectric conversion device according to the second embodiment.

Subsequently, a planar structure and a cross-sectional structure of the photoelectric conversion device of the present embodiment will be described. FIG. 10 schematically illustrates the planar structure of the photoelectric conversion device. FIG. 11 schematically illustrates a cross-sectional structure of the photoelectric conversion device. The cross-section illustrated in FIG. 11 corresponds to a cross-section taken along the broken line X1-X2 in FIG. 10. Substantially the same portions as those in FIG. 4 or FIGS. 5A and 5B are designated by the same reference numerals. Also in FIG. 10, the drain of the reset transistor 102 and the drain of the amplifier transistor 104 are connected to the same power supply line Vdd/Vres. In the present embodiment, the reset voltage Vres and the power supply voltage Vdd are set to different voltages. When resetting, a voltage supply source (not illustrated) applies the reset voltage Vres to the power supply line Vdd/Vres. When the signal is read out of the amplifier transistor 104, the voltage supply source supplies the power supply voltage Vdd different from the reset voltage Vres to the power supply line Vdd/Vres. The reset voltage Vres and the power supply voltage Vdd can be also set to the same voltage. A plurality of power supply lines for respectively supplying the reset voltage Vres and the power supply voltage Vdd may be arranged.

As illustrated in FIGS. 10 and 11, the lower electrode 213 of the first capacitor 103 is connected to a conductive member 420. The conductive member 420 is an interconnection for supplying the voltage Vd from the voltage supply unit 410. In the present embodiment, the conductive member 420 is arranged every row and is electrically insulated from the conductive members 420 of other rows. According to such a configuration, the voltage Vd of the second terminal (node C) of the first capacitor 103 can be independently controlled every row.

Since configurations other than the foregoing structure are similar to those in the first embodiment, their description is omitted here.

Subsequently, the operation of the photoelectric conversion unit 101 of the present embodiment will be described. Each of FIGS. 12A to 12G schematically illustrates an energy band diagram in the photoelectric conversion unit 101. The energy bands of the first electrode 201, blocking layer 203, photoelectric conversion layer 205, insulating layer 207, and second electrode 209 are illustrated FIGS. 12A to 12G. An axis of ordinate of FIGS. 12A to 12G indicates a potential to the electron. The potential to the electron is higher the upper side in FIG. 12A to FIG. 12G.

Therefore, the voltage is lower the upper side in FIG. 12A to FIG. 12G. With respect to each of the first electrode 201 and the second electrode 209, an energy level of the free electron is illustrated. With respect to each of the blocking layer 203 and the photoelectric conversion layer 205, an energy band gap between an energy level of a conduction band and an energy level of a valence band is illustrated. The potential of the photoelectric conversion layer 205 at the interface between the photoelectric conversion layer 205 and the insulating layer 207 is conveniently called a surface potential of the photoelectric conversion layer 205, or is simply called a surface potential.

As an operation of the photoelectric conversion unit 101, the operations of the following steps (1) to (6) are repeatedly executed. Step (1) is a step of resetting an input node of the amplifier unit. Step (2) is a step of executing the readout of the noise signal N (N-signal read). Step (3) is a step of removing the signal charges from the photoelectric conversion unit (charge removing operation). Step (4) is a step of executing the readout of the light signal S (S-signal read). Step (5) is a step of performing the removal of the residual charges from the photoelectric conversion unit (charge ejecting operation) and the reset before the start of the accumulation of the signal charges. Step (6) is a step of performing the accumulation of the signal charges (accumulating operation). That is, in the present embodiment, the charge removing operation is executed multiple times between the first accumulating operation and the second accumulating operation which is executed after the first accumulating operation, the accumulating operation being executed multiple times including the first and second accumulating operations. Each of the foregoing steps will be described hereinbelow.

Figure 12A:
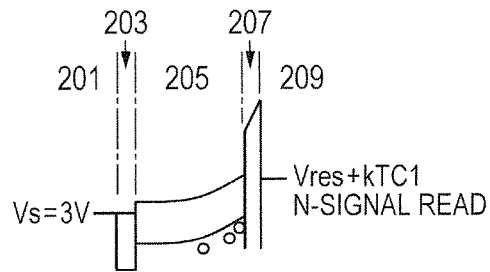
FIGS. 12A, 12B, 12C, 12D, 12E, 12F and 12G are diagrams each schematically illustrating a potential distribution of a photoelectric conversion unit of the photoelectric conversion device according to the second embodiment.

FIG. 12A illustrates a state of the photoelectric conversion unit 101 in steps (1) and (2). The voltage Vs is supplied to the first electrode 201. The voltage Vs is, for example, 3 V. The holes illustrated by white circles are accumulated in the photoelectric conversion layer 205 as signal charges generated during the exposure period of time. The surface potential of the photoelectric conversion layer 205 changes in such a direction that it decreases (such a direction that the voltage increases) in accordance with an amount of accumulated holes. When the electrons are accumulated, the surface potential changes in such a direction that it increases (such a direction that the voltage decreases) in accordance with an amount of electrons which are accumulated. The first voltage Vd1 is supplied to the node C. The first voltage Vd1 is, for example, 0 V.

The reset transistor 102 is turned on in this state. Thus, the voltage of the node including the second electrode 209, that is, the node B in FIG. 8 is reset to the reset voltage Vres (FD reset). In the present embodiment, the gate of the amplifier transistor 104 is included in the node B. Therefore, the voltage of the gate of the amplifier transistor 104 is reset. The reset voltage Vres is, for example, 1 V.

After that, the reset transistor 102 is turned off. Thus, the node B enters an electrical floating state. At this time, the reset noise (noises kTC1 in FIGS. 12A to 12C) by the reset transistor 102 may be generated.

The surface potential of the photoelectric conversion layer 205 can change in accordance with the change in voltage of the second electrode 209 caused by the reset operation. A changing direction of the voltage of the second electrode 209 at this time is a direction opposite to that of the change in voltage of the second electrode 209 caused by the accumulation of the signal charges. Therefore, the holes of the signal charges are held in a state where they are accumulated in the photoelectric conversion layer 205.

Since the injection of the holes from the first electrode 201 is blocked by the blocking layer 203, the amount of signal charges accumulated in the photoelectric conversion layer 205 does not change.

If the select transistor 105 is ON, the amplifier transistor 104 outputs the noise signal N (Vres+kTC1) containing the reset noise from the pixel 100 (N-signal read). The noise signal N is held in the capacitor CTN of the column circuit 140.

Figure 12B:
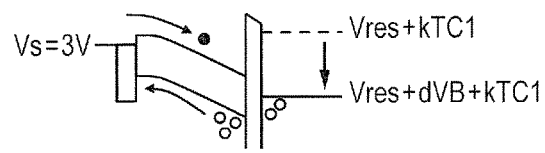
Figure 12C:
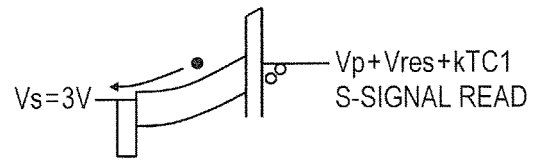

FIGS. 12B and 12C illustrate states of the photoelectric conversion unit 101 in step (3). First, the second voltage Vd2 is supplied to the node C. Since the holes are used as signal charges, the second voltage Vd2 is higher than the first voltage Vd1. The second voltage Vd2 is, for example, 5 V.

At this time, the voltage of the second electrode 209 (node B) changes in the same direction as that of the change in voltage of the node C. The change amount dVB of the voltage of the second electrode 209 is determined in accordance with a ratio between the capacitance value C1 of the first capacitor 103 connected to the second electrode 209 and the capacitance value C2 of the second capacitor 111 which the photoelectric conversion unit 101 has. The change amount dVB of the voltage of the second electrode 209 to a change amount dVd of the voltage of the node C is expressed by (dVB=dVd×C1/(C1+C2)). The node B including the second electrode 209 can contain other capacitive components. However, the other capacitive components are sufficiently smaller than the capacitance value C1 of the first capacitor 103. Therefore, it may be regarded that the capacitance value of the node B is equal to the capacitance value C1 of the first capacitor 103.

In the present embodiment, the change amount dVB of the voltage of the second electrode 209 is sufficiently larger than a difference (Vs−Vres) between the voltage Vs of the first electrode 201 and the reset voltage Vres. Therefore, the potential of the second electrode 209 is lower than the potential of the first electrode 201 and the inclination of the potential in the photoelectric conversion layer 205 is inverted. Therefore, the electrons illustrated by black circles are injected from the first electrode 201 into the photoelectric conversion layer 205. A part or all of the holes accumulated in the photoelectric conversion layer 205 as signal charges are moved to the blocking layer 203. The moved holes are recombined with the majority carriers in the blocking layer 203 and are extinguished. Thus, the holes in the photoelectric conversion layer 205 are removed from the photoelectric conversion layer 205. If the whole photoelectric conversion layer 205 is depleted, all of the holes accumulated as signal charges are removed.

Subsequently, in the state illustrated in FIG. 12C, the first voltage Vd1 is supplied to the node C. Thus, the inclination of the potential in the photoelectric conversion layer 205 is inverted again. Therefore, the electrons injected into the photoelectric conversion layer 205 in the state of FIG. 12B are removed from the photoelectric conversion layer 205. The blocking layer 203 blocks the injection of the holes from the first electrode 201 into the photoelectric conversion layer 205. Therefore, the surface potential of the photoelectric conversion layer 205 changes in accordance with the amount of accumulated holes. In correspondence to the change in surface potential, the voltage of the second electrode 209 changes by an amount of the voltage Vp according to the amount of extinguished holes from the reset state. That is, the voltage Vp according to the amount of holes accumulated as signal charges appears in the node B. The voltage Vp according to the amount of accumulated holes is called a light signal component.

The select transistor 105 is turned on in the state illustrated in FIG. 12C. Thus, the amplifier transistor 104 outputs the light signal S (Vp+Vres+kTC1) from the pixel 100. The light signal S is held in the capacitor CTS of the column circuit 140. The difference between the reset signal (Vres+kTC1) which is read out in step (2) and the light signal S (Vp+Vres+kTC1) which is read out in step (4) is a signal (light signal component) based on the voltage Vp according to the accumulated signal charges.

Figure 12D:
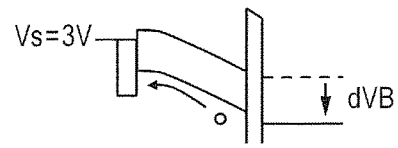
Figure 12E:
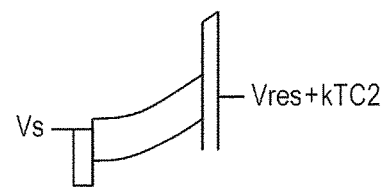

FIGS. 12D and 12E illustrate states of the photoelectric conversion unit 101 in step (5). In the present embodiment, in FIG. 12D, by swinging the voltage on the side of the second electrode 209 via the first capacitor 103, the photoelectric conversion layer 205 is reset. After that, in FIG. 12E, the reset transistor 102 is turned on and the voltage of the node B is reset to the reset voltage Vres (FD reset). That is, the present embodiment differs from the first embodiment with respect to the timing for the film reset and the timing for the FD reset. In a manner similar to FIG. 12B, the voltage applied to the second electrode 209 changes from the first voltage Vd1 to the second voltage Vd2 and, further, from the second voltage Vd2 to the first voltage Vd1. By swinging the voltage applied to the second electrode 209 as mentioned above, all of the photo-induced charges in the photoelectric conversion layer 205 can be removed (film reset). The dark charges and the photo-induced charges (in the present embodiment, the light is always irradiated) accumulated in the photoelectric conversion layer 205 for a period of time from FIG. 12C to the reset before the start of the accumulation are contained in the charges which are removed. The photo-induced charges which remain in the photoelectric conversion layer 205 without being perfectly read out in the charge removing step in FIG. 12B are also contained. Thus, such a situation that the residual charges or the like of the previous frame exert an influence on the light signal component of the next frame can be prevented.

As mentioned above, by resetting the node B before the start of the accumulation of the signal charges, the light signal component of the previous frame accumulated in the node B can be eliminated. Such a situation that the light signal component is successively accumulated in the node B and the dynamic range is narrowed can be prevented.

Also at this time, the reset noise (noise kTC2 in FIGS. 12E and 12G) due to the reset transistor 102 may be generated. However, the reset noise which is generated here can be eliminated by executing the reset operation of step (1) after the end of the accumulating period of time.

Figure 12F:
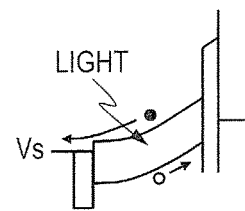
Figure 12G:
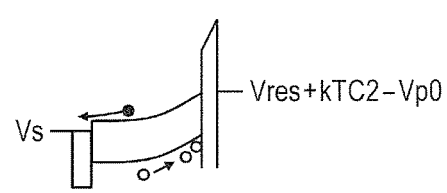

FIGS. 12F and 12G illustrate states of the photoelectric conversion unit 101 in step (6). The voltage Vs is supplied to the first electrode 201 and the reset voltage Vres is supplied to the node B. Since the reset voltage Vres is lower than the voltage Vs of the first electrode 201, the electrons in the photoelectric conversion layer 205 are removed to the first electrode 201. On the other hand, the holes in the photoelectric conversion layer 205 are moved toward the interface between the photoelectric conversion layer 205 and the insulating layer 207. However, since the holes cannot be moved to the insulating layer 207, they are accumulated in the photoelectric conversion layer 205. As mentioned above, the blocking layer 203 blocks such a state that the holes are injected into the photoelectric conversion layer 205. Therefore, if the light enters the photoelectric conversion layer 205 in this state, only the holes in the electron-hole pairs generated by the photoelectric conversion are accumulated as signal charges in the photoelectric conversion layer 205. After the accumulation is performed for a predetermined period of time, the operations of steps (1) to (6) are repeated.

The surface potential of the photoelectric conversion layer 205 changes by the accumulated holes. The voltage of the second electrode 209 rises in accordance with such a change in surface potential. Such a voltage is illustrated by Vp0 in FIG. 12G. At the time of resetting in FIG. 12A, as mentioned above, the voltage of the second electrode 209 changes so as to set off the changed voltage Vp0. That is, the voltage of the second electrode 209 decreases. Therefore, the surface potential of the photoelectric conversion layer 205 changes in such a direction that it rises.

If the signal charges are the electrons, the second voltage Vd2 is higher than the first voltage Vd1. Therefore, the inclination of the potential in FIGS. 12A to 12G is inverted. Other operations are substantially the same as those in the foregoing case.

The effect of the noise reduction in the present embodiment will now be described. In the operations described with reference to FIGS. 12A to 12G, since the inclination of the potential in the photoelectric conversion layer 205 is inverted in the state of FIG. 12B, the accumulated holes are removed. If the inclination of the potential in the photoelectric conversion layer 205 cannot be inverted, the charges which are not removed are generated, so that there is a possibility of occurrence of noise. As the change amount dVB of the voltage of the second electrode 209 (node B) is larger than a difference (Vs−Vres) between the voltage Vs of the first electrode 201 and the reset voltage Vres, it is liable to invert the inclination of the potential. In other words, as the change amount dVB of the voltage of the second electrode 209 is larger than the difference (Vs−Vres) between the voltage Vs of the first electrode 201 and the reset voltage Vres, the noise can be reduced.

As mentioned above, there is a relation of (dVB=dVd× C1/(C1+C2)) between the change amount dVd of the voltage of the voltage of the node C and the change amount dVB of the voltage of the node B. That is, the larger the capacitance value C1 of the node B is, the larger the change amount dVB of the voltage of the node B is.

In the present embodiment, the first capacitor 103 is connected to the second electrode 209. Therefore, the capacitance value C1 of the node B can be increased. According to such a configuration, the change amount dVB of the voltage of the node B can be increased. Thus, since the photoelectric conversion layer 205 can be easily depleted, the charges which are not removed can be reduced. As mentioned above, according to the present embodiment, the noises can be decreased.

As a comparison, a configuration in which the first capacitor 103 is not connected to the node B will be described. In this case, the capacitance of the node B may contain the capacitive component due to the p-n junction of the semiconductor region and the parasitic capacitive component with the interconnections. However, those capacitive components are so small that they can be ignored as compared with the capacitance value C2 of the second capacitor 111 which the photoelectric conversion unit 101 has. Therefore, a value of C1/(C1+C2) is almost zero. Thus, even if the voltage Vd of the node C is changed, the voltage of the node B hardly changes. Therefore, in the state of FIG. 12B, there is a possibility that the inclination of the potential is not inverted. As a result, a possibility that a part of the holes accumulated as signal charges cannot be removed occurs. Since the amount of signal charges which are not removed can be reduced in the present embodiment as compared with the comparison, the noise can be decreased.

Subsequently, a relation among the capacitance value C1 of the first capacitor 103, the capacitance value C2 of the second capacitor 111 included in the photoelectric conversion unit 101, and the voltage which is supplied to each unit will be described. In the present embodiment, the capacitance value C1 and the capacitance value C2 are expressed by the equations (4) and (1) in the first embodiment. A detailed description is omitted here.

In the present embodiment, by controlling the voltage Vd of the node C to the first voltage Vd1 and the second voltage Vd2, the accumulation of the signal charges and the removal of the signal charges due to the depletion of the photoelectric conversion layer 205 are performed. If the capacitance value C1 of the first capacitor 103 and the capacitance value C2 of the second capacitor 111 satisfy a relation, which will be described hereinafter, at the time of the removal of the signal charges mentioned above, the charges remaining in the photoelectric conversion layer 205 can be effectively reduced. First, a description will be made with respect to the case where the signal charges are the holes.

For simplicity of description, it is assumed hereinbelow that the capacitance value C1 of the first capacitor 103 is k times as large as the capacitance value C2 of the second capacitor 111. That is, the capacitance value C1 and the capacitance value C2 have a relation expressed by the following equation (18).

$$C1 = k \times C2 \quad (18)$$

As mentioned above, the change amount dVd of the voltage of the node C and the change amount dVB of the voltage of the second electrode 209 (node B) have a relation expressed by the following equation (19).

$$dVB = dVd \times C1/(C1+C2) \quad (19)$$

The following equation (20) is obtained from the equations (18) and (19).

$$dVB = dVd \times k/(1+k) \quad (20)$$

In order to accumulate the holes as signal charges here, it is desirable that the voltage Vs which is supplied to the first electrode 201 (node A) and the reset voltage Vres satisfy a relation expressed by the following expression (21).

$$Vs > Vres \quad (21)$$

In order to transfer the holes of the signal charges, it is desirable that the voltage Vs of the first electrode 201 (node A), the reset voltage Vres, and the change amount dVB of the voltage of the second electrode 209 satisfy a relation expressed by the following expression (22).

$$Vs < Vres + dVB \quad (22)$$

When the relation of the expression (21) is satisfied, the inclination of the potential adapted to allow the holes to drift toward the insulating layer 207 can be formed in the photoelectric conversion layer 205. When the relation of the expression (22) is satisfied, the inclination of the potential in the photoelectric conversion layer 205 can be easily inverted.

The following expression (23) is obtained from the equation (20) and the expression (22).

$$Vs - Vres < dVd \times k/(1+k) \quad (23)$$

When the signal charges are the holes, the second voltage Vd2 is higher than the first voltage Vd1. That is, the change amount (dVd=Vd2−Vd1) of the voltage of the node C is a positive value. Therefore, even if both sides of the expression (23) is divided by dVd, the direction of the inequality does not change.

Therefore, from the expression (23), a relation expressed by the following expression (24) is obtained with respect to the capacitance ratio k between the capacitance values C1 and C2.

$$1-1/(1+k) > (Vs-Vres)/dVd \quad (24)$$

If the relation of the expression (24) is satisfied, the amount of charges which are not removed can be reduced. Therefore, the noise can be decreased.

In the present embodiment, the voltage Vs of the first electrode 201 is 3 V and the reset voltage Vres is 1 V. Since the first voltage Vd1 is 0 V and the second voltage Vd2 is 5 V, the change amount dVd of the voltage of the node C is equal to 5 V. Therefore, a value of k is set to a value larger than ⅔. Specifically speaking, in the present embodiment, the capacitance value C1 of the first capacitor 103 is 4 fF and the capacitance value C2 of the second capacitor 111 is 1 fF. That is, k=4. According to such a configuration, the noise can be further reduced.

In the present embodiment, when seen as a plan view, the area Sd of the upper electrode 211 or the lower electrode 213 of the first capacitor 103 and the area Ss of the second electrode 209 satisfy a relation of Sd>0.5×Ss. According to such a configuration, the foregoing relation of the capacitance ratio can be easily obtained.

The larger the value of k is, the larger the effect of the noise reduction is. Therefore, when the capacitance value C1 of the first capacitor 103 is equal to or larger than the capacitance value C2 of the second capacitor 111, the effect of the noise reduction can be further raised.

The change amount dVd of the voltage of the node C is expressed by (dVd=Vd2−Vd1) by using the first voltage Vd1 and the second voltage Vd2. The left side of the expression (24) can be rewritten to (C1/(C1+C2)) by using the equation (18). Therefore, the expression (24) is modified to the following expression (25).

$$C1/(C1+C2) > (Vs-Vres)/(Vd2-Vd1) \quad (25)$$

Subsequently, a case where the signal charges are the electrons will be described. When the signal charges are the electrons, the direction of the inequality of each of the expressions (21) and (22) also changes. Therefore, the direction of the inequality of the expression (23) also changes. That is, when the signal charges are the electrons, the following expression (26) is obtained.

$$Vs-Vres > dVd \times k/(1+k) \quad (26)$$

However, when the signal charges are the electrons, the second voltage Vd2 is lower than the first voltage Vd1. That is, the change amount (dVd=Vd2−Vd1) of the voltage of the node C is a negative value. Therefore, if both sides of the expression (26) is divided by dVd, the direction of the inequality changes. Thus, the expressions (24) and (25) are obtained in a manner similar to the case where the signal charges are the holes.

The relation shown by the expression (25) will now be described. The more the reset voltage Vres is close to the voltage Vs which is supplied to the first electrode 201 of the photoelectric conversion unit 101, a value of the right side is small. That is, even if the capacitance value C1 of the first capacitor 103 is small, the inclination of the potential in the photoelectric conversion layer 205 can be inverted. When a difference between the reset voltage Vres and the voltage Vs which is supplied to the first electrode 201 is small, the amount of charges which can be accumulated in the photoelectric conversion layer 205 is small.

On the other hand, the larger the difference between the reset voltage Vres and the voltage Vs is, the value of the right side is large. That is, a large value is used as a capacitance value C1 of the first capacitor 103. At this time, since the difference between the reset voltage Vres and the voltage Vs is large, the amount of charges which can be accumulated in the photoelectric conversion layer 205 can be increased.

In order to obtain a good balance between a saturation charge amount and the capacitance value C1 of the first capacitor 103, it is desirable that the difference between the reset voltage Vres and the voltage Vs lies within a range of 20% to 80% of the difference between the first voltage Vd1 and the second voltage Vd2. For example, when the first voltage Vd1 is 0 V and the second voltage Vd2 is 5 V, it is desirable that the difference between the reset voltage Vres and the voltage Vs lies within a range of 1 V to 4 V.

Particularly, if the difference between the first voltage Vd1 and the second voltage Vd2 is increased, even if the difference between the reset voltage Vres and the voltage Vs is large, the capacitance value C1 of the first capacitor 103 can be decreased. However, if the photoelectric conversion device is used as an image sensor of a camera or the like, a low power supply voltage is used in order to realize low electric power consumption. For example, in many cases, the power supply voltage which is applied to the image sensor is equal to or less than 5 V. Therefore, a voltage of 5 V or less is also used as each voltage shown in the expressions (24) and (25). Therefore, it is difficult to increase the difference between the first voltage Vd1 and the second voltage Vd2. In such a case, if the capacitance value C1 of the first capacitor 103 and the capacitance value C2 of the second capacitor 111 satisfy the foregoing relation, the noise can be reduced while driving the photoelectric conversion device by a low voltage.

As described above, the noise can be reduced by the relation between the capacitance value C1 of the first capacitor 103 and the capacitance value C2 of the second capacitor 111 included in the photoelectric conversion unit 101.

The numerical values mentioned above are merely an example and the present invention is not limited to those values. There is a possibility that a defect level or the like exists at an interface between the photoelectric conversion layer 205 and the insulating layer 207. In such a case, it is sufficient to consider a flat band voltage on the basis of the prior arts.

Figure 13:
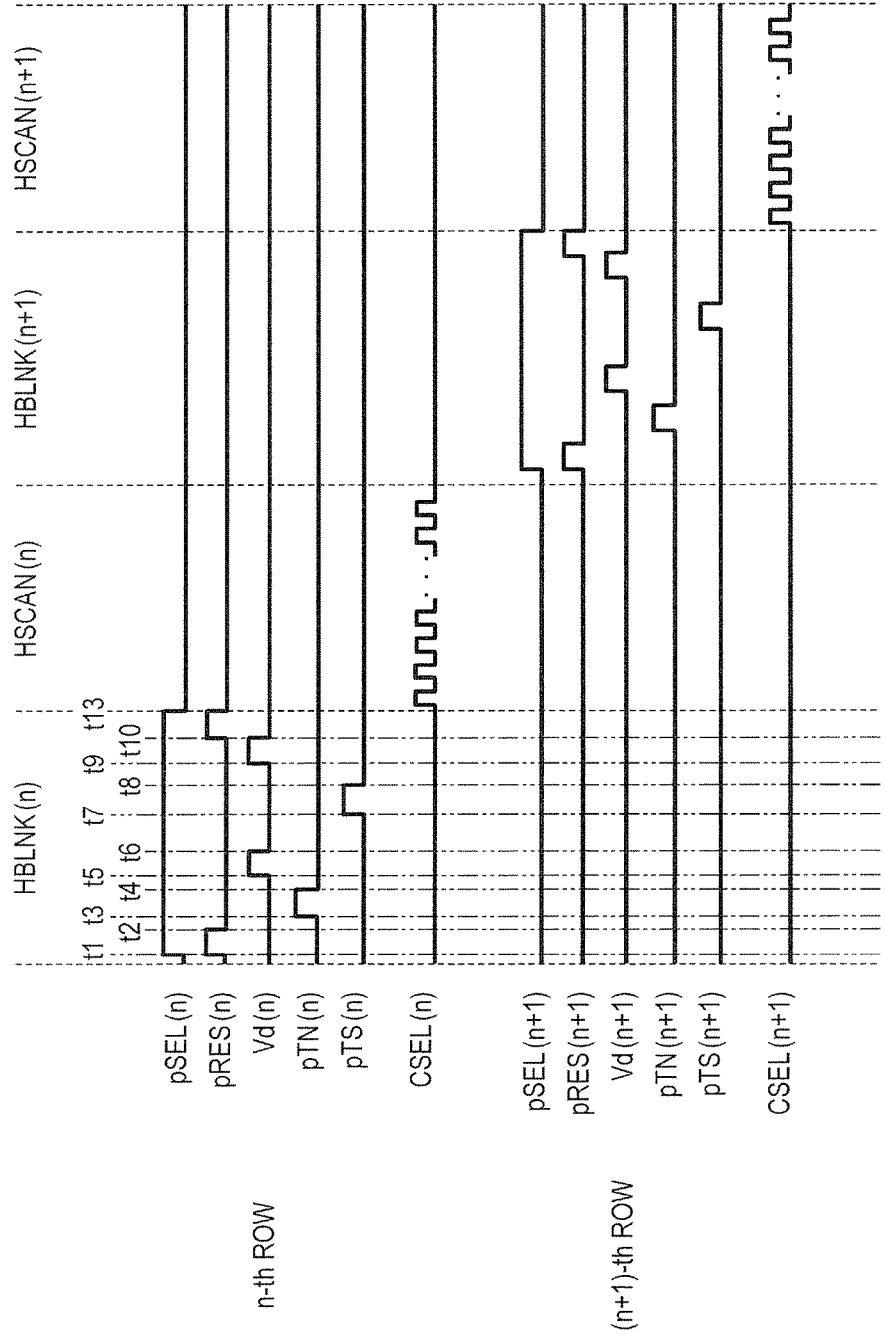
FIG. 13 is a diagram illustrating a timing chart of driving signals which are used in the photoelectric conversion device according to the second embodiment.

Subsequently, a method of driving the photoelectric conversion device of the present embodiment will be described. FIG. 13 illustrates a timing chart of driving signals which are used in the photoelectric conversion device of the present embodiment. The driving signals corresponding to the read-out operation of the signals of two rows of the n-th row and the (n+1)-th row are illustrated in FIG. 13. Only points different from those of the timing of the driving signals of the first embodiment will be described here.

A first point different from the driving method of the first embodiment is a point that the voltage signal Vd is supplied to the node C in FIG. 8. A timing chart of the voltage signal Vd is illustrated in FIG. 13. The voltage signal Vd includes the first voltage Vd1 and the second voltage Vd2. The period of time during which the voltage signal Vs is the first voltage Vs1 in the first embodiment corresponds to a period of time during which the voltage signal Vd is the first voltage Vd1 in the present embodiment. The period of time during which the voltage signal Vs is the second voltage Vs2 in the first embodiment corresponds to a period of time during which the voltage signal Vd is the second voltage Vd2 in the present embodiment.

A second point different from the driving method of the first embodiment is a point that the timing for the film reset and the timing for the FD reset differ from those in the first embodiment. According to the driving method of the first embodiment, the film reset and the FD reset are simultaneously executed for a period of time between time t9 and time t10 in FIG. 7. On the other hand, according to the driving method of the present embodiment, the film reset and the FD reset are executed for different periods of time.

That is, in the example illustrated in FIG. 13, at time t9, the voltage signal Vd(n) is shifted from the first voltage Vd1 to the second voltage Vd2. A state of the energy band of the photoelectric conversion unit 101 at this time is illustrated in FIG. 12D. Thus, the film reset is performed by removing all of the charges remaining in the photoelectric conversion layer 205. At time t10, the voltage signal Vd(n) is shifted from the second voltage Vd2 to the first voltage Vd1. A state of the energy band of the photoelectric conversion unit 101 at this time is illustrated in FIG. 12E.

The driving signal pRES(n) is set to the high level at time t10 and the driving signal pRES(n) is set to the low level at time t13. Thus, the voltage of the node B of the pixel 100 of the n-th row is again reset to the reset voltage Vres (FD reset). Although the FD reset is performed after the film reset in the present embodiment, the FD reset may be performed just before the film reset.

As mentioned above, the photoelectric conversion device of the present embodiment includes the node B which is configured in such a manner that it is electrically connected to the second electrode 209 of the photoelectric conversion unit 101 and enters an electrical floating state. The first capacitor 103 is connected to the node B. According to such a configuration, the photoelectric conversion layer 205 of the photoelectric conversion unit 101 can be easily depleted. Thus, the noise can be reduced.

By executing the charge removing operation (film reset) from the photoelectric conversion layer after the light signal S is read out, all of the photo-induced charges remaining in the photoelectric conversion layer can be removed. Thus, such a situation that the residual charges or the like of the previous frame exert an influence on the light signal component of the next frame can be prevented.

Third Embodiment

A photoelectric conversion device according to a third embodiment of the present invention will be described with reference to FIGS. 14 to 15.

In the present embodiment, a method of controlling the accumulation time by executing the shutter operation in the photoelectric conversion device according to the second embodiment is shown. FIG. 14 is a diagram illustrating a relation between the readout operation and the reset operation in the photoelectric conversion device according to the present embodiment. FIG. 15 illustrates a timing chart of driving signals which are used in the photoelectric conversion device according to the present embodiment. The present embodiment will be described hereinbelow with reference to those drawings.

In the method of driving the photoelectric conversion device according to the present embodiment, after the signal readout operation of a certain frame is executed, the reset operation is executed before the signal of the next frame is read out. FIG. 14 illustrates a case, as an example, where with respect to the pixel of the n-th row, after the signal readout operation of the N-th frame is executed at time tread1, the reset operation is executed at time treset1. With respect to the pixel of the n-th row, the readout operation of the (N+1)-th frame is executed at time tread2 subsequent to time treset1 and the reset operation is executed at time treset2. That is, a period of time from the reset operation to the next readout operation is an accumulation time of the next frame. In the example of FIG. 14, a period of time from time treset1 to time tread2 is an accumulation time of the (N+1)-th frame.

The readout operation at time tread1 is similar to the signal readout operation for a period of time between time t1 and time t13 in FIG. 13. After the signal of the pixel 100 of the n-th row is read out at time tread1 in FIG. 14, the shutter operation of the pixel 100 of the n-th row is executed at time treset2.

In the shutter operation, the film reset and the FD reset are executed in a manner similar to the film reset and the FD reset in the signal readout operation. In the example of FIG. 15, the driving signal pRES(n) is set to the high level and a voltage signal Vd(n) is shifted from the first voltage Vd1 to the second voltage Vd2. Thus, after all of the charges remaining in the photoelectric conversion layer 205 are removed and the film reset is performed, the node B is reset by the reset voltage Vres.

Figure 14:
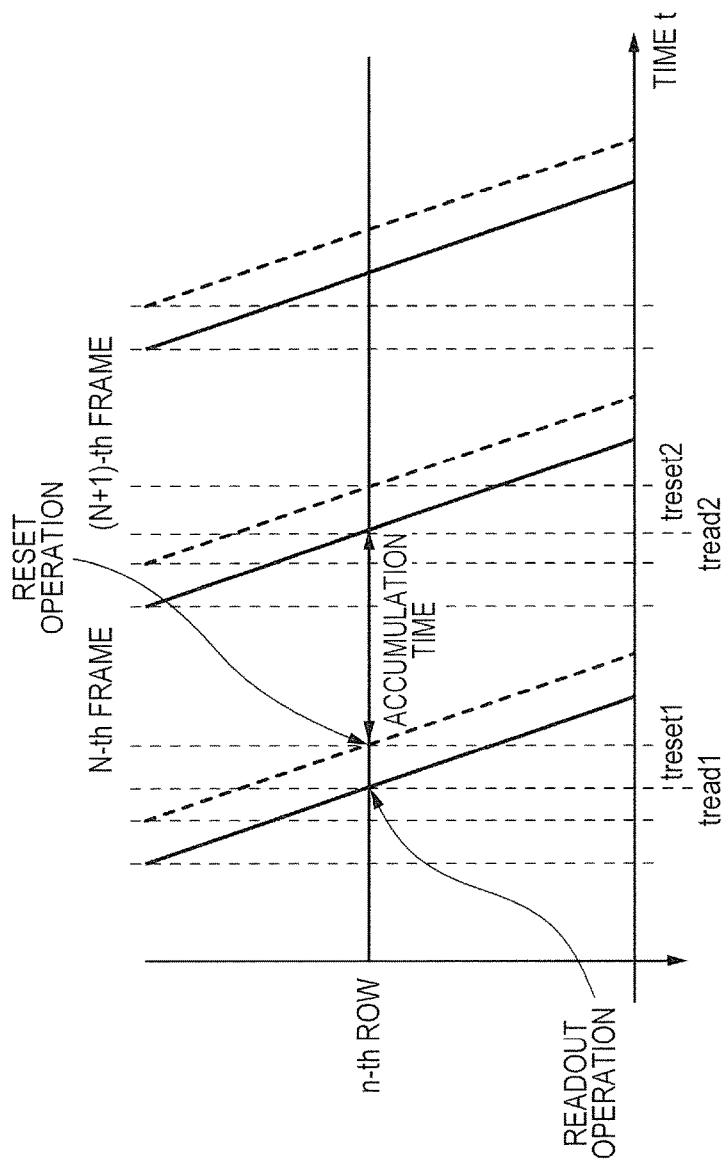
FIG. 14 is a diagram schematically illustrating a configuration of a pixel of a photoelectric conversion device according to a third embodiment.
Figure 15:
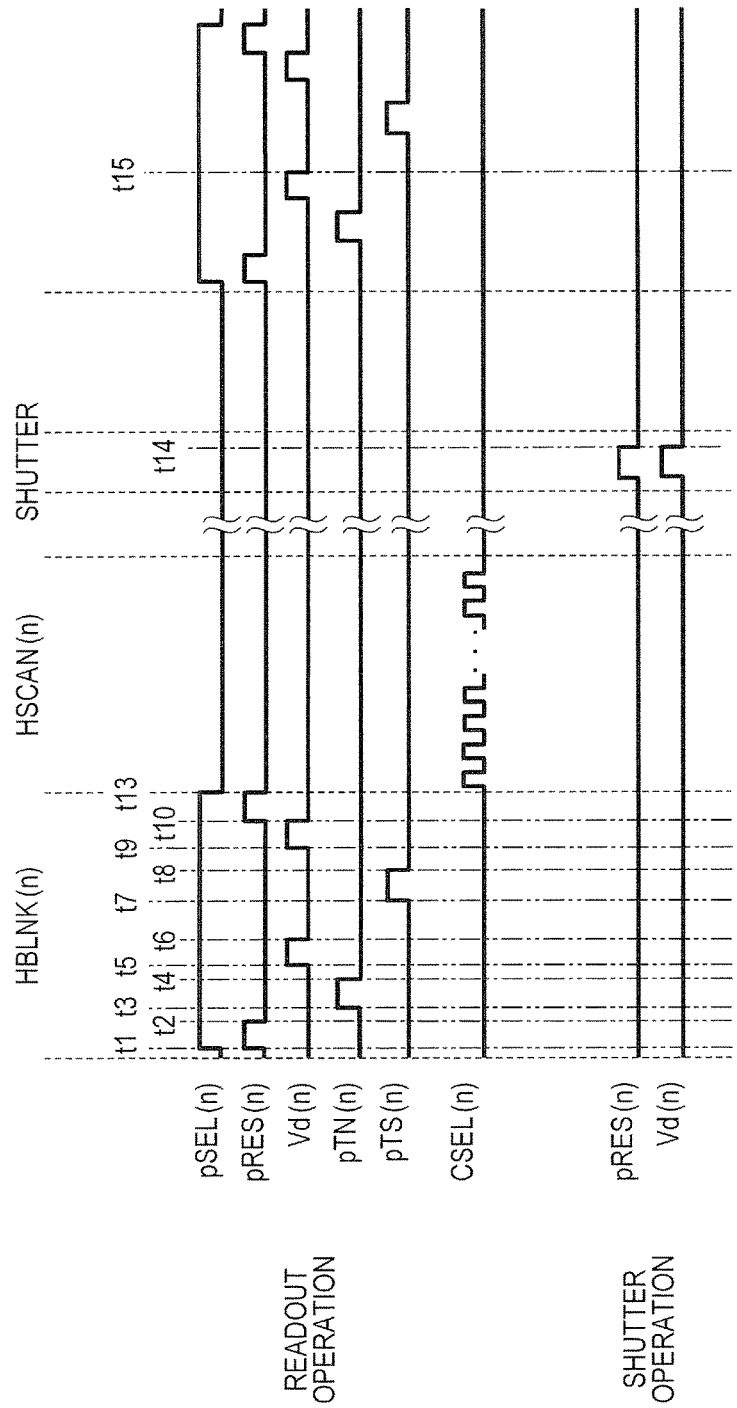
FIG. 15 is a diagram illustrating a timing chart of driving signals which are used in the photoelectric conversion device according to the third embodiment.

That is, in FIG. 14, all of the signal charges accumulated in the photoelectric conversion layer 205 for the period of time between time tread1 and time treset1 are removed by the foregoing reset operation (film reset). A period of time from time treset1 to time tread2 for the next signal readout, more specifically speaking, a period of time between time t14 and time t15 in FIG. 15 becomes an accumulation time of the (N+1)-th frame. By introducing such a shutter operation, the accumulation time can be controlled.

Fourth Embodiment

A photoelectric conversion device according to a fourth embodiment of the present invention will be described with reference to FIGS. 16 and 17.

The photoelectric conversion device according to the present embodiment differs from the photoelectric conversion devices according to the first to third embodiments with respect to a point that a pixel includes a clamp circuit connected to a post stage of an amplifier unit. In the present embodiment, portions different from those in the first to third embodiments will be mainly described and a description about substantially the same portions as those in any one of the first to third embodiments is properly omitted here.

Figure 16:
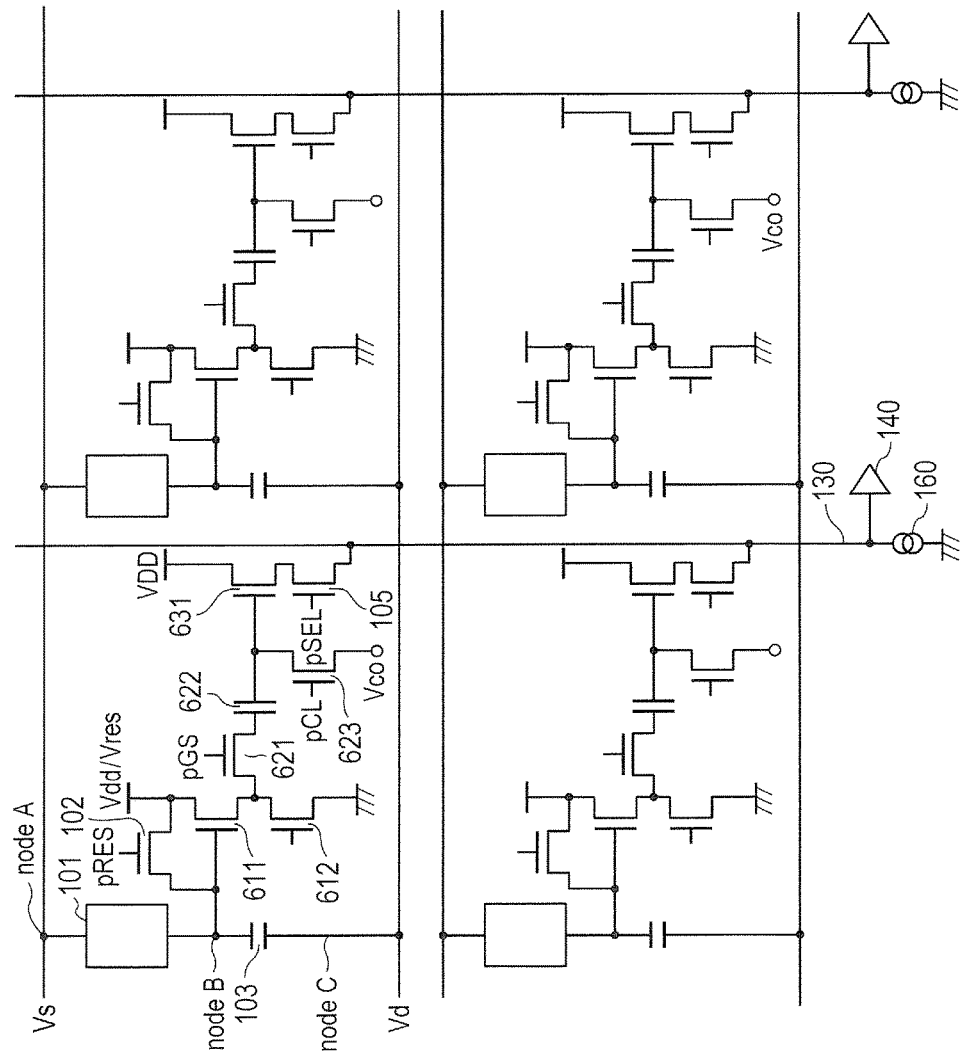
FIG. 16 is a diagram schematically illustrating a configuration of a pixel of a photoelectric conversion device according to a fourth embodiment.
Figure 17:
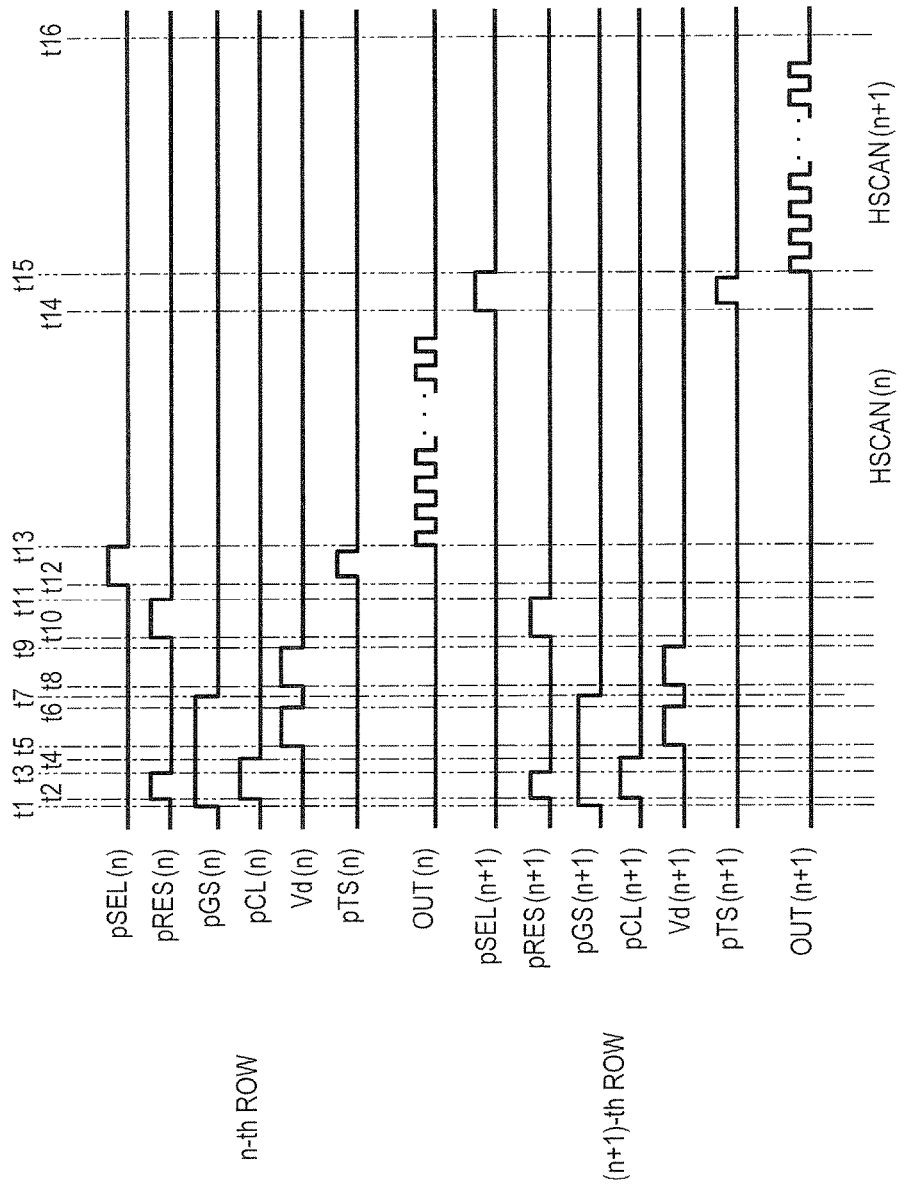
FIG. 17 is a diagram illustrating a timing chart of driving signals which are used in the photoelectric conversion device according to the fourth embodiment.

FIG. 16 schematically illustrates a configuration of the pixel 100 of the photoelectric conversion device according to the present embodiment. Four pixels 100 of 2 rows and 2 columns are illustrated in FIG. 16. Portions having substantially the same functions as those in FIG. 1A are designated by the same reference numerals. A structure of the photoelectric conversion unit 101 is similar to that in any one of the first to third embodiments. Therefore, a cross-sectional structure of the photoelectric conversion unit 101 is not illustrated in FIG. 16.

In the present embodiment, the pixel 100 includes two amplifier units. The first amplifier unit is a source-follower circuit including a first amplifier transistor 611 and a current source 612. The second amplifier unit includes a second amplifier transistor 631. The second amplifier transistor 631 is connected to the output line 130 via the select transistor 105. The second amplifier transistor 631 and the current source 160 connected to the output line 130 constitute a source-follower circuit. In the present embodiment, the reset voltage Vres and the power supply voltage Vdd are supplied from the same power supply line. As mentioned in the second embodiment, the reset voltage Vres and the power supply voltage Vdd can be also set to different voltages.

The pixel 100 includes a clamp circuit for performing a global electronic shutter. The clamp circuit includes a clamp switch 621, a clamp capacitor 622, and a clamp voltage supply switch 623. The clamp switch 621 is arranged on an electric path between the node B to which the first capacitor 103 is connected and an input node of the second amplifier unit of the pixel 100. A driving signal pGS is supplied to the clamp switch 621. A driving signal pCL is supplied to the clamp voltage supply switch 623.

The clamp circuit clamps the noise signal N which is output from the first amplifier unit. After that, the first amplifier unit outputs the light signal S, so that the clamp circuit can eliminate noise such as reset noise or the like contained in the light signal S. According to such a configuration, the global electronic shutter operation can be realized while eliminating random noise such as reset noise or the like.

Subsequently, a method of driving the photoelectric conversion device according to the present embodiment will be described. FIG. 17 illustrates a timing chart of driving signals which are used in the photoelectric conversion device according to the present embodiment. The driving signals corresponding to the readout operation of the signals of two rows of the n-th row and the (n+1)-th row are illustrated in FIG. 17. In the present embodiment, since the correlated double sampling is performed in the pixel, it is sufficient that the column circuit 140 in FIG. 3 is only a circuit including the S/H switch 303 and the capacitor CTS. The S/H switch 303 is controlled by the driving signal pTS.

The driving method of the present embodiment differs from that in the second embodiment with respect to a point that the driving signal pGS is supplied to the clamp switch 621 and the driving signal pCL is supplied to the clamp voltage supply switch 623. A timing chart of the voltage signal Vd is illustrated in FIG. 17. When the driving signal is at the high level, the corresponding switch is on-state. When the driving signal is at the low level, the corresponding switch is off-state.

At time t1, a driving signal pGS(n) and a driving signal pGS(n+1) are set to the high level and the clamp switch 621 is turned on. At time t2, the driving signal pRES(n) and a driving signal pRES(n+1) are set to the high level. At time t2, a driving signal pCL(n) and a driving signal pCL(n+1) are set to the high level. After that, at time t3, the driving signal pRES(n) and the driving signal pRES(n+1) are set to the low level. At time t4, the driving signal pCL(n) and the driving signal pCL(n+1) are set to the low level. Thus, the clamp circuits of the pixels 100 of the n-th row and the (n+1)-th row clamp the noise signal N.

Subsequently, at time t5, the voltage signal Vd(n) and a voltage signal Vd(n+1) are shifted from the first voltage Vd1 to the second voltage Vd2. Thus, the accumulated signal charges are removed. At time t6, the voltage signal Vd(n) and the voltage signal Vd(n+1) are set to the first voltage Vd1. Thus, the light signal component is generated in the node B. At this time, since the clamp switch 621 is ON, the voltage Vp corresponding to the amount of signal charges is generated in the clamp capacitor 622.

After that, at time t7, the driving signal pGS(n) and the driving signal pGS(n+1) are set to the low level. Thus, the clamp circuit of the pixel 100 is electrically isolated from the photoelectric conversion unit 101.

Subsequently, at time t8, the voltage signal Vd(n) and the voltage signal Vd(n+1) are shifted from the first voltage Vd1 to the second voltage Vd2. At time t9, the voltage signal Vd(n) and the voltage signal Vd(n+1) are shifted from the second voltage Vd2 to the first voltage Vd1. Thus, all of the signal charges remaining in the photoelectric conversion layer 205 are removed (film reset).

Subsequently, at time t10, the driving signal pRES(n) and the driving signal pRES(n+1) are set to the high level. At time t11, the driving signal pRES(n) and the driving signal pRES(n+1) are set to the low level. Thus, the node B is reset by the reset voltage (FD reset).

In the subsequent operation, the light signal S is read out every row. Since such an operation is substantially the same as that in the second embodiment, its description is omitted.

By the foregoing operation, the global electronic shutter operation can be realized. In the present embodiment, the pixel 100 includes the clamp circuit. According to such a configuration, the random noise such as reset noise or the like can be reduced.

Fifth Embodiment

A photoelectric conversion device according to a fifth embodiment of the present invention will be described with reference to FIG. 18.

The photoelectric conversion device according to the present embodiment differs from the photoelectric conversion devices according to the first to fourth embodiments with respect to a point that a pixel includes a sample and hold circuit connected to a post stage of an amplifier unit. In the present embodiment, portions different from those of the first to third embodiments will be mainly described and a description about substantially the same portions as those in any one of the first to fourth embodiments is properly omitted here.

Figure 18:
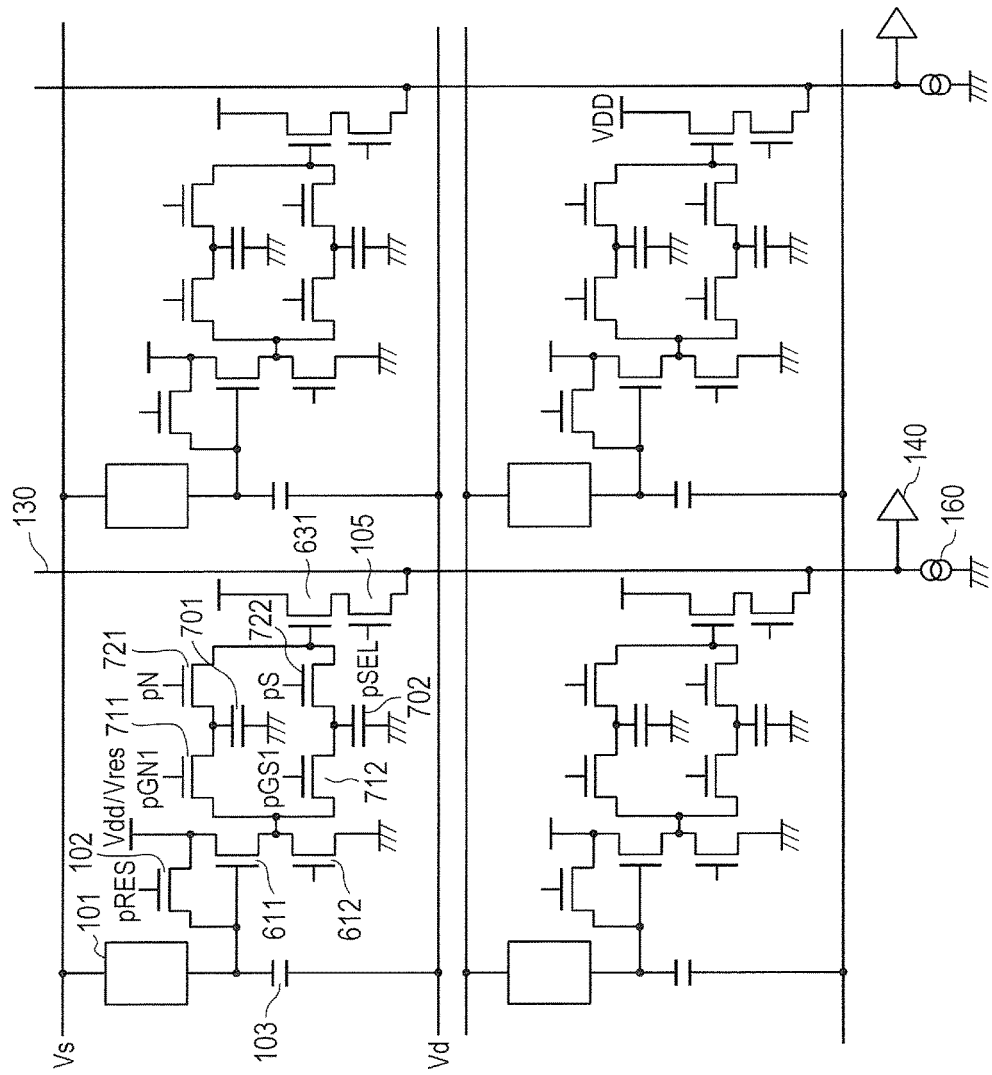
FIG. 18 is a diagram schematically illustrating a configuration of a pixel of a photoelectric conversion device according to a fifth embodiment.

FIG. 18 schematically illustrates a configuration of the pixel 100 of the photoelectric conversion device according to the present embodiment. Four pixels 100 of 2 rows and 2 columns are illustrated in FIG. 18. Portions having substantially the same functions as those in FIG. 1A or FIG. 16 are designated by the same reference numerals. A structure of the photoelectric conversion unit 101 is similar to that in any one of the first to fourth embodiments. Therefore, a cross sectional structure of the photoelectric conversion unit 101 is not illustrated in FIG. 18.

In the present embodiment, the pixel 100 includes two amplifier units. The first amplifier unit is a source-follower circuit including the first amplifier transistor 611 and the current source 612. The second amplifier unit includes the second amplifier transistor 631. The second amplifier transistor 631 is connected to the output line 130 via the select transistor 105. The second amplifier transistor 631 and the current source 160 connected to the output line 130 constitute a source-follower circuit.

The pixel 100 includes a sample and hold circuit (hereinbelow, referred to as an S/H circuit) for performing the global electronic shutter. The pixel 100 includes an S/H circuit for the noise signal N and an S/H circuit for the light signal S. The S/H circuit for the noise signal N holds the noise signal N which is output from the first amplifier unit. The S/H circuit for the light signal S holds the light signal S which is output from the first amplifier unit. The S/H circuit for the noise signal N includes a capacitor 701, a first switch 711, and a second switch 721. The S/H circuit for the light signal S includes a capacitor 702, a first switch 712, and a second switch 722. In the present embodiment, the reset voltage Vres and the power supply voltage Vdd are supplied from the same power supply line. As mentioned in the second embodiment, the reset voltage Vres and the power supply voltage Vdd can be also set to different voltages.

According to such a configuration, the global electronic shutter operation can be realized while eliminating the random noise such as reset noise or the like.

Subsequently, a method of driving the photoelectric conversion device according to the present embodiment will be described. In this instance, the driving of the S/H circuit for performing the global electronic shutter operation will be described.

First, in a state where the input node of the first amplifier unit are reset, the first switch 711 of the S/H circuit for the noise signal N of each of the pixels 100 of all rows is turned on. Thus, the noise signal N is held in the capacitor 701. Subsequently, the transfer operation of the signal charges is executed. This is similar to that in any one of the first to fourth embodiments. Then, the first switch 712 of the S/H circuit for the light signal S of each of all of the pixels 100 is turned on. Thus, the light signal S is held. After that the second switches 721 and 722 are turned on every row. Therefore, the signals from the pixels 100 are read out every row. The signals which are output from the pixels are held in the column circuit 140 in a manner similar to the first embodiment and a differential process to eliminate the noise is executed.

By the foregoing operation, the global electronic shutter operation can be realized. In the present embodiment, the pixel 100 includes the S/H circuit. According to such a configuration, the random noises such as reset noise or the like can be reduced.

Sixth Embodiment

An imaging system according to a sixth embodiment of the present invention will be described with reference to FIG. 19. As an imaging system, a digital still camera, a digital camcorder, a camera head, a copying apparatus, a facsimile, a cellular phone, an onboard camera, an observation satellite, or the like can be mentioned. A block diagram of the digital still camera is illustrated in FIG. 19 as an example of the imaging system.

Figure 19:
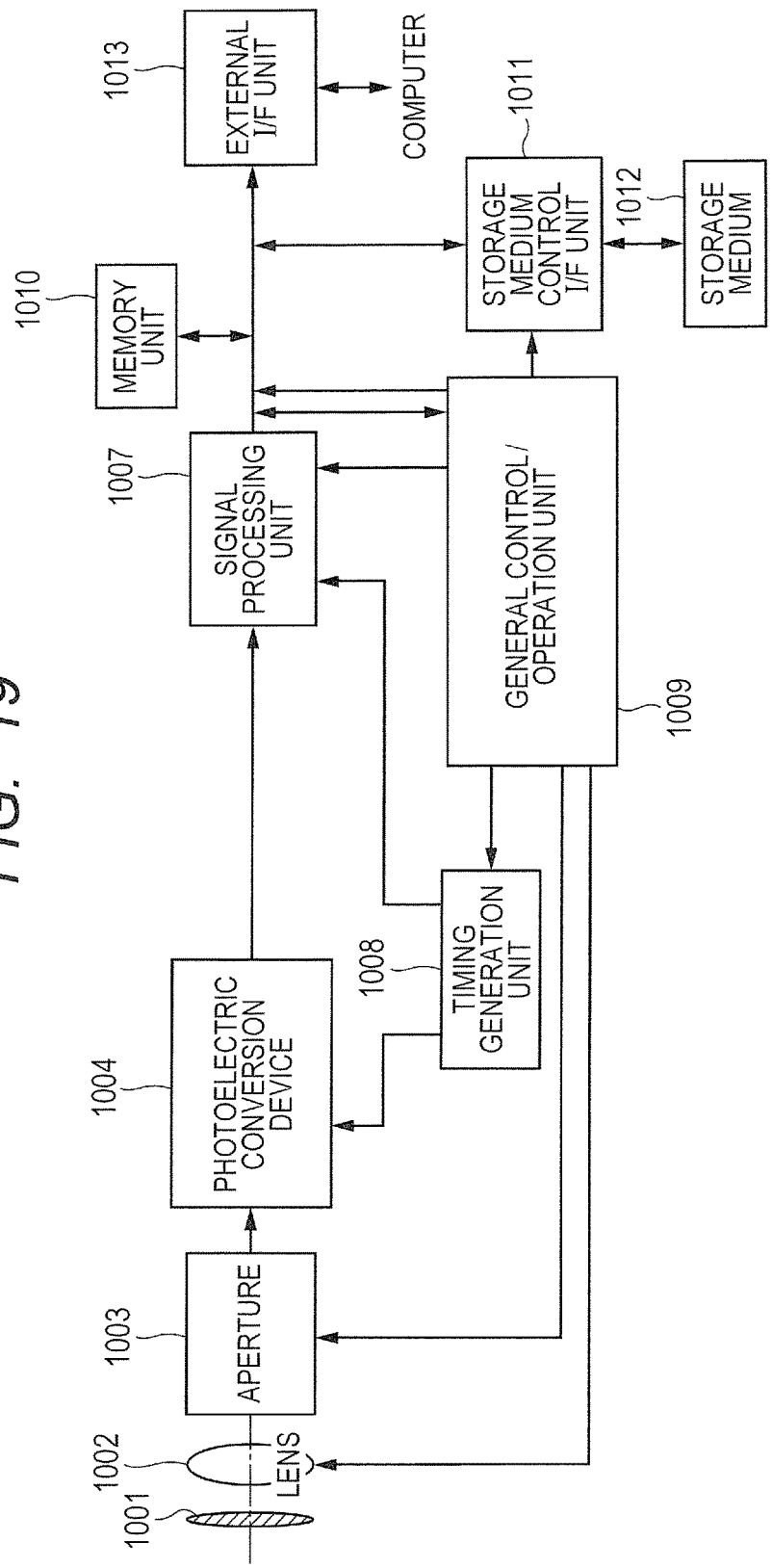
FIG. 19 is a block diagram of an imaging system according to the sixth embodiment.

In FIG. 19, the imaging system includes a barrier 1001 for protecting a lens, a lens 1002 for forming an optical image of an object onto a photoelectric conversion device 1004, and an aperture 1003 for varying an amount of light which passed through the lens 1002. The photoelectric conversion device 1004 is the photoelectric conversion device described in each of the foregoing embodiments and converts the optical image formed by the lens 1002 as image data. It is assumed that an A/D conversion unit is formed on a semiconductor substrate of the photoelectric conversion device 1004. A signal processing unit 1007 is provided to perform various kinds of corrections to the image data which is output from the photoelectric conversion device 1004 and compress the data. In FIG. 19, a timing generation unit 1008 is provided to output various kinds of timing signals to the photoelectric conversion device 1004 and the signal processing unit 1007. A general control/operation unit 1009 is provided to control the whole digital still camera. A frame memory unit (memory unit) 1010 is provided to temporarily store the image data. A storage medium control interface (I/F) unit 1011 is provided to record or read out the image data into/from a storage medium. A storage medium 1012 is a detachable memory such as a semiconductor memory or the like for recording or reading out the image data. An external interface (I/F) unit 1013 is provided to communicate with an external computer or the like. The timing signals or the like may be input from the outside of the imaging system. It is sufficient that the imaging system includes at least the photoelectric conversion device 1004 and the signal processing unit 1007 for processing the image signal which is output from the photoelectric conversion device 1004.

In the present embodiment, the configuration in which the photoelectric conversion device 1004 and the A/D conversion unit are provided on the different semiconductor substrates is described. However, the photoelectric conversion device 1004 and the A/D conversion unit may be provided on the same semiconductor substrate. The photoelectric conversion device 1004 and the signal processing unit 1007 may be formed on the same semiconductor substrate.

Each pixel 100 may be configured so as to include a plurality of photoelectric conversion units, for example, a first photoelectric conversion unit and a second photoelectric conversion unit. The signal processing unit 1007 may be configured so as to process a signal based on charges generated in the first photoelectric conversion unit and a signal based on the charges generated in the second photoelectric conversion unit and obtain information of a distance from the photoelectric conversion device 1004 to the object.

In the embodiment of the imaging system, the photoelectric conversion device of any one of the first to fifth embodiments is used as a photoelectric conversion device 1004. By applying the embodiments according to the present invention in the imaging system, the image in which the noise are reduced can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-230335, filed Nov. 26, 2015, which is hereby incorporated by reference herein in its entirety.

What is claimed is:

1. A photoelectric conversion device comprising:
a photoelectric conversion unit including a first electrode, a second electrode, a photoelectric conversion layer arranged between the first electrode and the second electrode, and an insulating layer arranged between the photoelectric conversion layer and the second electrode;
an amplifier unit electrically connected to the second electrode and configured to output a signal generated in the photoelectric conversion unit; and
a reset unit configured to supply a reset voltage to the second electrode, wherein
in accordance with a voltage applied between the first electrode and the second electrode, an accumulating operation for accumulating signal charges in the photoelectric conversion unit and a charge removing operation for removing the signal charges accumulated by the accumulating operation from the photoelectric conversion unit are alternately executed, and
the charge removing operation is executed multiple times between a first accumulating operation and a second accumulating operation which is executed after the first accumulating operation, the accumulating operation being executed multiple times including the first and second accumulating operations.

2. The photoelectric conversion device according to claim 1, wherein
the amplifier unit outputs the signal during the charge removing operation executed multiple times.

3. The photoelectric conversion device according to claim 2, wherein
the reset unit resets the second electrode synchronously with the charge removing operation which is executed at or after a second time in the charge removing operation executed multiple times.

4. The photoelectric conversion device according to claim 3, further comprising:
a first capacitor including a first terminal electrically connected to the second electrode and a second terminal; and
a voltage supply unit configured to supply at least a first voltage and a second voltage different from the first voltage to the second terminal, wherein
a voltage Vs supplied to the first electrode, the first voltage Vd1, the second voltage Vd2, the reset voltage Vres, a capacitance value C1 of the first capacitor, and a capacitance value C2 of a second capacitor which is formed by the first electrode and the second electrode satisfy a relation shown by the following expression:

$C1/(C1+C2) > (Vs-Vres)/(Vd2-Vd1)$.

5. The photoelectric conversion device according to claim 4, wherein
when the signal charges are accumulated in the photoelectric conversion layer, the first voltage is supplied to the second terminal, and
when the signal charges are removed from the photoelectric conversion layer, the second voltage is supplied to the second terminal.

6. The photoelectric conversion device according to claim 4, wherein
a difference between the voltage supplied to the first electrode and the reset voltage lies within a range of 20% to 80% of a difference between the first voltage and the second voltage.

7. The photoelectric conversion device according to claim 3, further comprising:
a first capacitor electrically connected to the second electrode; and
a voltage supply unit configured to supply at least a first voltage and a second voltage different from the first voltage to the first electrode, wherein
the first voltage Vs1, the second voltage Vs2, the reset voltage Vres, a capacitance value C1 of the first capacitor, and a capacitance value C2 of a second capacitor which is formed by the first electrode and the second electrode satisfy a relation shown by the following expression:

$C1/C2 > (Vres-Vs1)/(Vs2-Vres)$.

8. The photoelectric conversion device according to claim 7, wherein
when the signal charges are accumulated in the photoelectric conversion layer, the first voltage is supplied to the first electrode, and
when the signal charges are removed from the photoelectric conversion layer, the second voltage is supplied to the first electrode.

9. The photoelectric conversion device according to claim 7, wherein
the reset voltage is an intermediate value between the first voltage and the second voltage.

10. The photoelectric conversion device according to claim 7, wherein
the first capacitor includes a first terminal electrically connected to the second electrode and a second terminal, and
the second terminal is grounded.

11. The photoelectric conversion device according to claim 4, wherein
the first capacitor includes two electrodes which face each other,
when seen as a plan view, the two electrodes and the first electrode overlap with each other at least partially, and
when seen as a plan view, the two electrodes and the second electrode overlap with each other at least partially.

12. The photoelectric conversion device according to claim 4, wherein
an input node of the amplifier unit is configured to include the second electrode.

13. The photoelectric conversion device according to claim 4, wherein
a switch is arranged on an electric path between the second electrode and the first capacitor.

14. The photoelectric conversion device according to claim 4, wherein
a switch is arranged on an electric path between the first capacitor and the amplifier unit.

15. The photoelectric conversion device according to claim 7, wherein
the first capacitor includes two electrodes which face each other,
when seen as a plan view, the two electrodes and the first electrode overlap with each other at least partially, and
when seen as a plan view, the two electrodes and the second electrode overlap with each other at least partially.

16. The photoelectric conversion device according to claim 7, wherein
an input node of the amplifier unit is configured to include the second electrode.

17. The photoelectric conversion device according to claim 7, wherein
a switch is arranged on an electric path between the second electrode and the first capacitor.

18. The photoelectric conversion device according to claim 7, wherein
a switch is arranged on an electric path between the first capacitor and the amplifier unit.

19. The photoelectric conversion device according to claim 1, wherein
the device includes a plurality of pixels each including the photoelectric conversion unit,
the first electrode is provided in common for the plurality of pixels, and
the second electrode is individually provided for each of the plurality of pixels.

20. An imaging system comprising:
the photoelectric conversion device according to claim 1; and
a signal processing apparatus configured to process a signal from the photoelectric conversion device.

* * * * *